(12) United States Patent
Kim et al.

(10) Patent No.: US 11,011,597 B2
(45) Date of Patent: May 18, 2021

(54) DISPLAY DEVICE HAVING A COMPENSATION TRANSISTOR WITH A SECOND REGION HAVING GREATER ELECTRICAL RESISTANCE THAN A FIRST REGION

(71) Applicant: Samsung Display Co., Ltd., Yongin-si (KR)

(72) Inventors: Sang Sub Kim, Suwon-si (KR); Mee Jae Kang, Suwon-si (KR); Han Bit Kim, Seoul (KR); Yong Su Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/842,239

(22) Filed: Apr. 7, 2020

(65) Prior Publication Data

US 2021/0066429 A1    Mar. 4, 2021

(30) Foreign Application Priority Data

Sep. 2, 2019   (KR) .......................... 10-2019-0107919

(51) Int. Cl.
  *H01L 27/32*    (2006.01)
  *H01L 29/786*   (2006.01)
  (Continued)

(52) U.S. Cl.
  CPC ....... *H01L 27/3276* (2013.01); *G09G 3/3266* (2013.01); *G09G 3/3275* (2013.01); *H01L 29/66765* (2013.01); *H01L 29/78624* (2013.01)

(58) Field of Classification Search
  CPC ........... H01L 27/3276; H01L 29/66765; H01L 29/78624; G09G 3/3266; G09G 3/3275
  See application file for complete search history.

(56) References Cited

U.S. PATENT DOCUMENTS

2004/0178446 A1    9/2004  Sundaresan
2016/0064411 A1*   3/2016  Park ..................... H01L 27/156
                                                    257/89
(Continued)

FOREIGN PATENT DOCUMENTS

JP    2004-95671 A    3/2004
KR    2000-0027685 A  5/2000
(Continued)

*Primary Examiner* — Michael Jung
(74) *Attorney, Agent, or Firm* — Lewis Roca Rothgerber Christie LLP

(57) ABSTRACT

A display device includes scan lines for scan signals, data lines for data voltages, and pixels connected to the scan and data lines, where each of the pixels includes a first transistor configured to control a driving current which flows from a first electrode to a second electrode according to a voltage applied to a gate electrode, a light-emitting element connected to the second electrode and configured to emit light according to the driving current, and a third transistor electrically connected between the gate electrode and the second electrode, the third transistor includes an active layer including a first region connected to the second electrode of the first transistor, a second region connected to the gate electrode of the first transistor, and a channel region between the first region and the second region, and electrical resistance of the second region is greater than electrical resistance of the first region.

9 Claims, 18 Drawing Sheets

(51) Int. Cl.
    *G09G 3/3266*     (2016.01)
    *H01L 29/66*     (2006.01)
    *G09G 3/3275*     (2016.01)

(56) References Cited

U.S. PATENT DOCUMENTS

| | | | | |
|---|---|---|---|---|
| 2016/0141350 | A1* | 5/2016 | Kim | H01L 27/3258 257/40 |
| 2016/0217743 | A1* | 7/2016 | Kim | H01L 27/28 |
| 2016/0232849 | A1* | 8/2016 | Jeon | G09G 3/3233 |
| 2017/0038427 | A1* | 2/2017 | Kim | G09G 3/3233 |
| 2018/0130409 | A1* | 5/2018 | Xiang | G09G 3/3225 |
| 2019/0371240 | A1* | 12/2019 | Mitani | G09G 3/3266 |

FOREIGN PATENT DOCUMENTS

| | | |
|---|---|---|
| KR | 10-0840098 B1 | 6/2008 |
| KR | 10-2017-0007617 A | 1/2017 |

\* cited by examiner

DISPLAY DEVICE HAVING A COMPENSATION TRANSISTOR WITH A SECOND REGION HAVING GREATER ELECTRICAL RESISTANCE THAN A FIRST REGION

CROSS-REFERENCE TO RELATED APPLICATION

This application claims priority to and the benefit of Korean Patent Application No. 10-2019-0107919 filed on Sep. 2, 2019, in the Korean Intellectual Property Office (KIPO), the entire disclosure of which is incorporated herein by reference.

BACKGROUND

1. Field

One or more aspects of embodiments of the present disclosure relate to a display device.

2. Description of the Related Art

In recent years, demand for display devices for displaying images in various forms has increased as the information society develops. For example, display devices are being used in various electronic devices such as smart phones, digital cameras, notebook computers, navigation devices, and smart televisions. Display devices may be flat display devices such as liquid crystal display devices, field emission display devices, organic light-emitting display devices, or the like. Among the flat display devices, the organic light-emitting display device includes light-emitting elements in which each of the pixels of a display panel emit light, and thus, each of the pixels may display an image without backlight units that provide light to the display panel.

SUMMARY

Aspects of one or more example embodiments of the present disclosure are directed toward a display device capable of suppressing or preventing degradation of element characteristics and reliability due to a phenomenon such as a leakage current or the like caused by high integration of a semiconductor device for driving a light-emitting element.

The scope of the present disclosure is not limited to the above-described object, and other unmentioned objects may be clearly understood by those skilled in the art from the following descriptions.

One or more embodiments of a display device include scan lines to which scan signals are applied, data lines to which data voltages are applied, and pixels connected to the scan lines and the data lines, where each of the pixels includes a first transistor configured to control a driving current which flows from a first electrode to a second electrode according to a voltage applied to a gate electrode, a light-emitting element connected to the second electrode of the first transistor and configured to emit light according to the driving current, and a third transistor electrically connected between the gate electrode and the second electrode of the first transistor, where the third transistor includes an active layer including a first region connected to the second electrode of the first transistor, a second region connected to the gate electrode of the first transistor, and a channel region between the first region and the second region, and where electrical resistance of the second region is greater than electrical resistance of the first region.

One or more embodiments of a transistor include a substrate, a semiconductor layer on the substrate, a first insulating layer on the semiconductor layer, and a first conductive layer on the first insulating layer and including a gate electrode, where the semiconductor layer includes a channel region which overlaps the gate electrode, a first region including a source region located at one side of the channel region in a first direction, and a second region including a drain region located at the other side of the channel region in the first direction, and where the first region and the second region are doped with same impurity ions, and a concentration of the impurity ions doped in the first region is greater than a concentration of the impurity ions doped in the second region.

Aspects of one or more example embodiments are directed to a display device capable of suppressing or preventing degradation of element characteristics and reliability due to a phenomenon such as a leakage current or the like caused by high integration of a semiconductor device for driving a light-emitting element can be provided.

Effects according to the example embodiments of the present disclosure are not limited by the content exemplified above, and more various effects are included in the specification.

BRIEF DESCRIPTION OF THE DRAWINGS

The above and other aspects and features of the present disclosure will become more apparent by describing example embodiments thereof in detail with reference to the attached drawings, in which.

DETAILED DESCRIPTION

Figure 1:
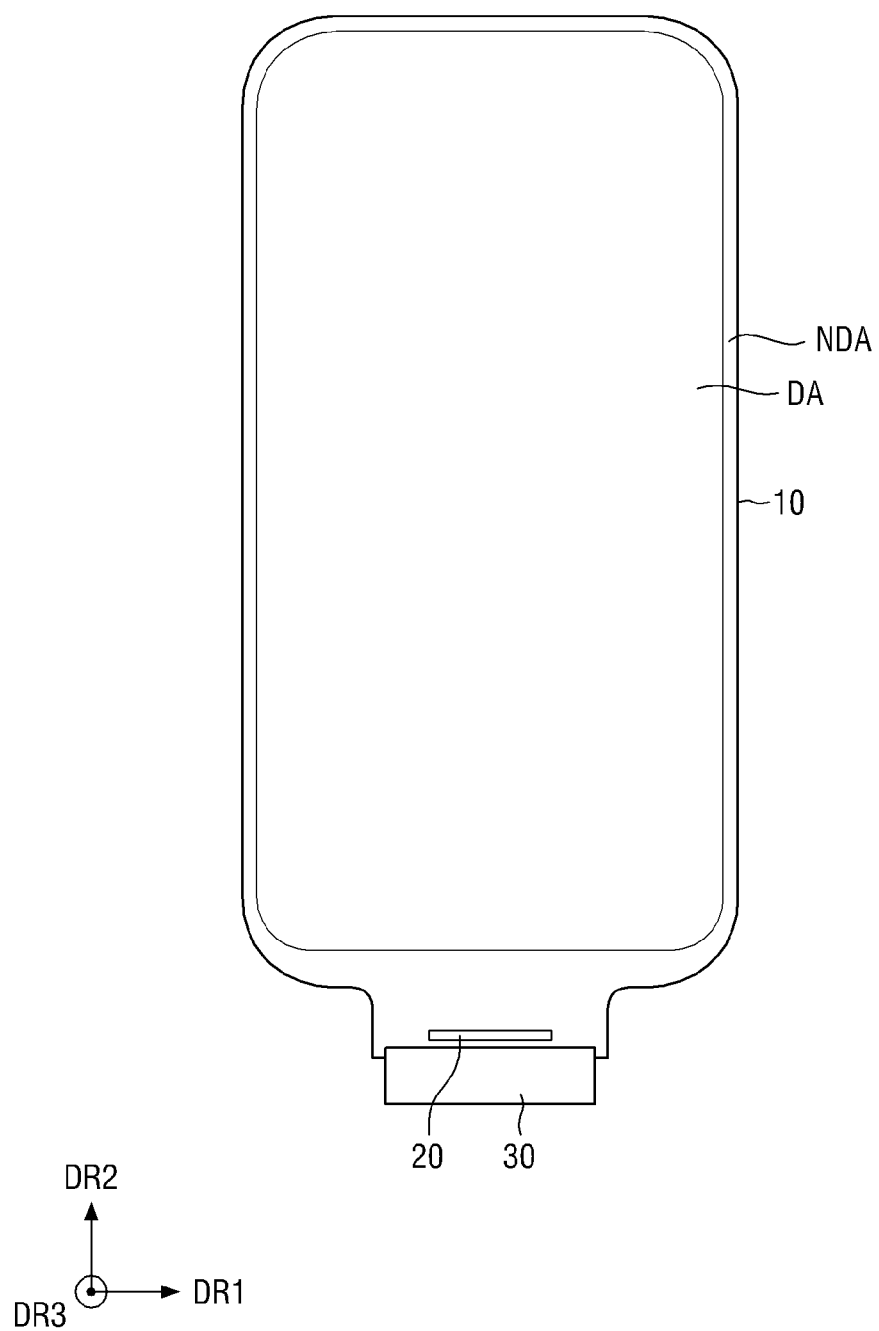
FIG. 1 is a perspective view illustrating a display device according to one or more embodiments of the present disclosure.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

As used herein, "a plan view" may refer to a view from top or from a direction normal to the display panel (or display plane) of the display device.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, the terms "use," "using," and "used" may be considered synonymous with the terms "utilize," "utilizing," and "utilized," respectively.

It will also be understood that when a layer is referred to as being "on" or "connected to" another layer or substrate, it can be directly on the other layer or substrate, or intervening layers may also be present. When an element is referred to as being "directly on" or "directly connected to" another element, there are no intervening elements present. The same reference numbers indicate the same components throughout the specification. In the attached figures, the thickness of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, specific embodiments will be described with reference to the accompanying drawings.

Figure 2:
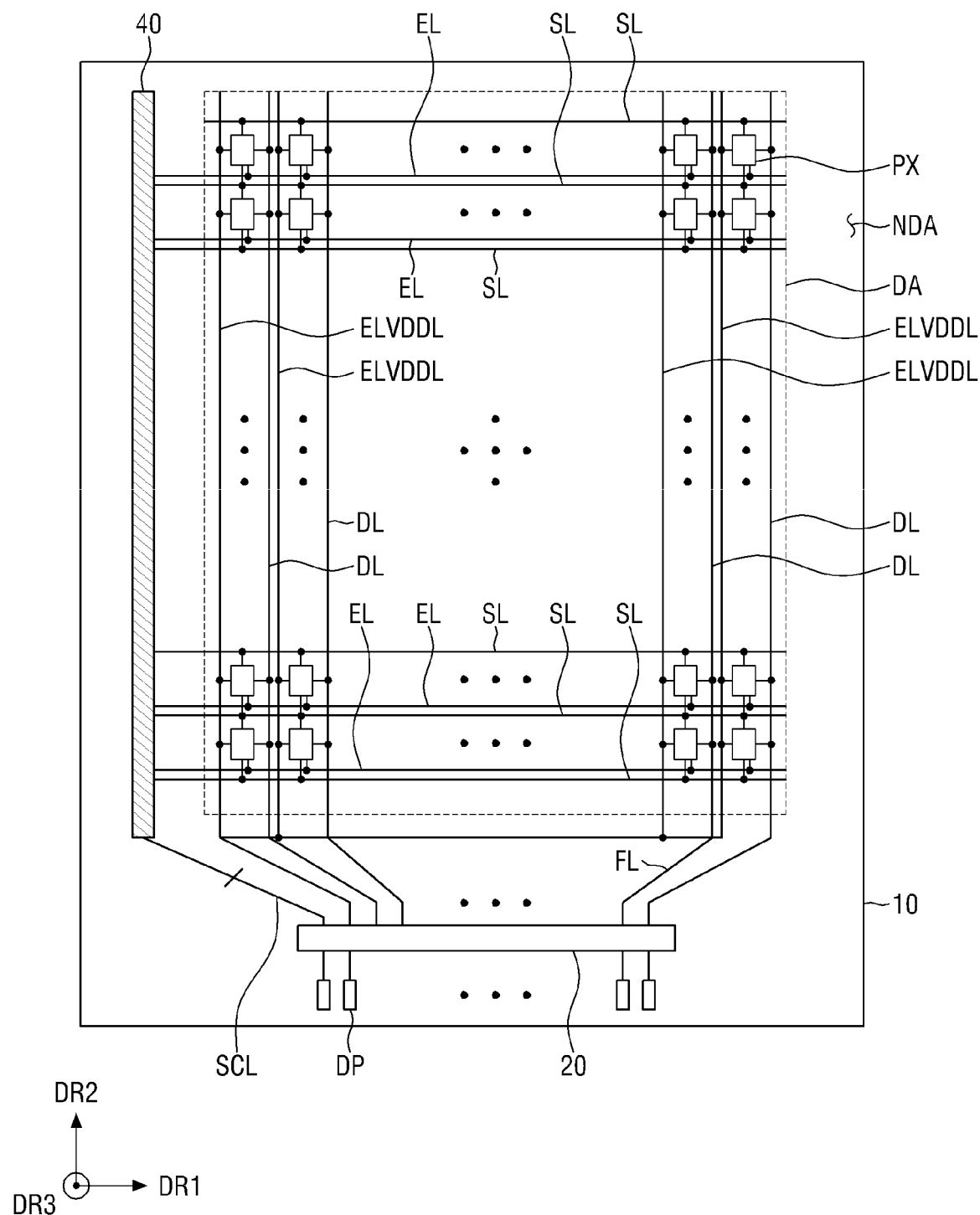
FIG. 2 is a plan view illustrating a display device according to one or more embodiments of the present disclosure.
Figure 3:
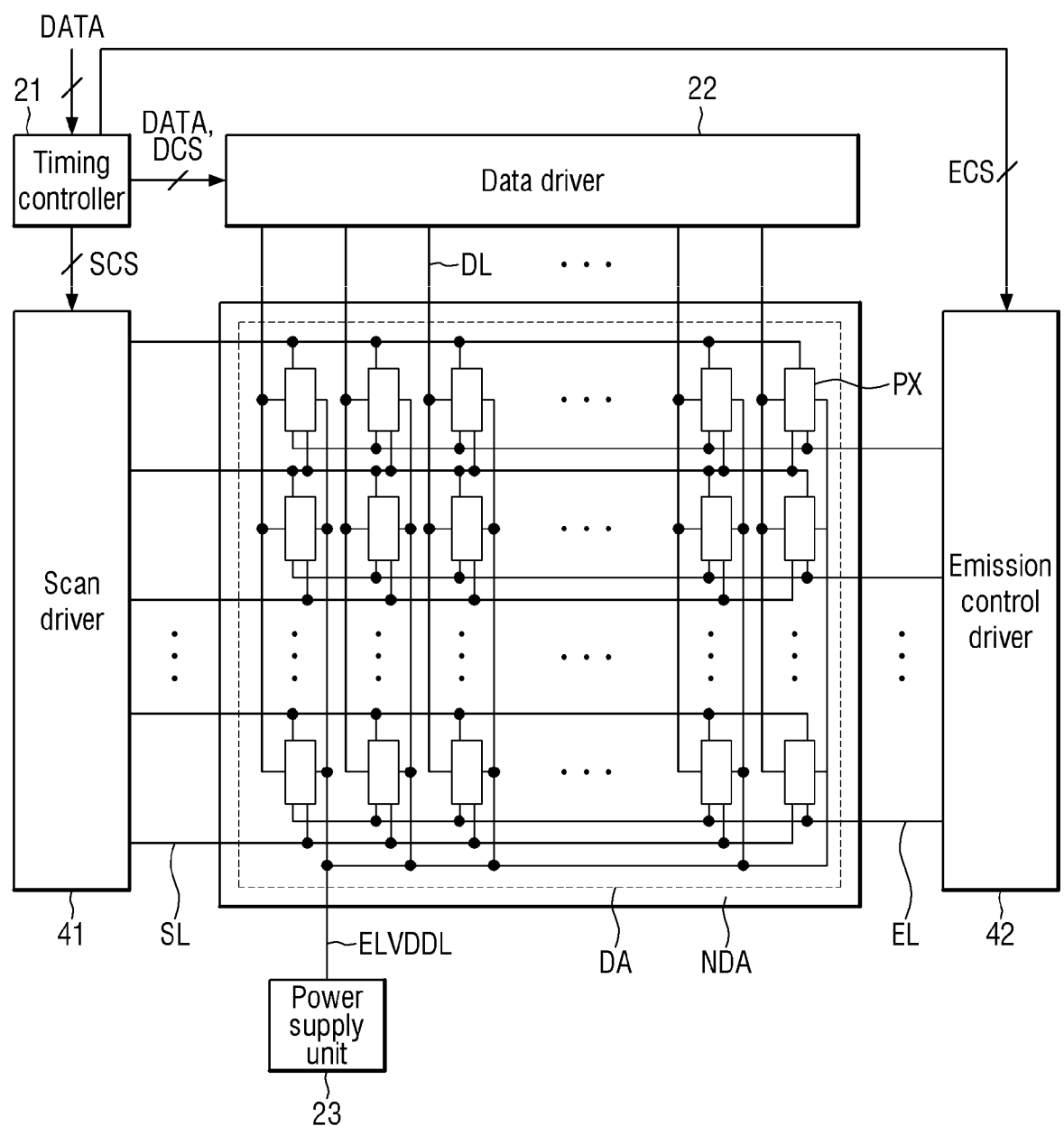
FIG. 3 is a block diagram illustrating a display device according to one or more embodiments of the present disclosure.

FIG. 1 is a perspective view illustrating a display device according to one or more embodiments. FIG. 2 is a plan view illustrating the display device according to one or more embodiments. FIG. 3 is a block diagram illustrating the display device according to one or more embodiments.

In the drawings (e.g., FIGS. 1, 2, 5 and 6), a first direction DR1 represents a lateral direction of a display device (e.g., display device 1 in FIG. 1) in the plan view and a second direction DR2 represents a longitudinal direction of the display device in the plan view. In addition, a third direction DR3 represents a thickness direction of the display device. The first direction DR1 and the second direction DR2 cross each other perpendicularly, and the third direction DR3 is a direction crossing a plane in which the first direction DR1 and the second direction DR2 are placed and crosses perpendicularly to both of the first direction DR1 and the second direction DR2. However, directions to be described in embodiments may be understood to refer to relative directions and the embodiments are not limited to the described directions.

Unless otherwise defined, in this specification, the term "upper portion," "upper surface," or "upper side" represented with respect to the third direction DR3 refers to a direction of a display surface with respect to a display panel 10, and the term "lower portion," "lower surface," or "lower side" refers to a direction opposite to the display surface with respect to the display panel 10.

The display device 1 may be a device for displaying moving images or still images, and the display device 1 may be used for display screens of portable electronic devices, such as mobile phones, smart phones, tablet personal computers (PCs), smart watches, watch phones, mobile communication terminals, electronic notebooks, e-books, portable multimedia players (PMPs), navigation systems, and ultra-mobile PCs (UMPCs), and also used for display screens of various products such as televisions, laptop computers, monitors, billboards, and Internet of Things devices.

The display device 1 according to one or more embodiments may have a substantially rectangular shape in the plan view. In one or more embodiments, the display device 1 may have a rectangular shape of which corners are a right angle in the plan view. However, the present disclosure is not limited thereto, and the display device 1 may have a rectangular shape of which corners are round in a plan view.

The display panel 10 may be an organic light-emitting display panel (OLED). In the following embodiment, an example in which an organic light-emitting display panel is applied as the display panel 10 is illustrated, but the present disclosure is not limited thereto, and other types of display panels, such as a liquid crystal display (LCD), a quantum dot organic light-emitting display panel (QD-OLED), a quantum dot LCD (QD-LCD), a quantum nano light-emitting display panel (a nano-emissive display (NED)), a micro LED, and the like may be applied as the display panel 10.

The display panel 10 may include a display region DA, in which pixels PX are formed to display an image, and a non-display region NDA which is a peripheral region of the display region DA. The display region DA may have a rectangular shape of which corners are a right angle in the plan view or may have a rectangular shape of which corners are round in the plan view. The display region DA may have short sides and long sides. The short sides of the display region DA may be sides extending in the first direction DR1. The long sides of the display region DA may be sides extending in the second direction DR2. However, a planar shape of the display region DA is not limited to the rectangular shape and may be a circular or elliptical shape, or various other shapes.

In the display region DA, not only the pixels PX but also scan lines SL, light-emitting lines EL, data lines DL, and first driving voltage lines ELVDDL which are connected to the pixels PX may be disposed. The scan lines SL and the light-emitting lines EL may be formed side by side in the first direction DR1, and the data lines DL may be formed side by side in the second direction DR2 crossing the first direction DR1. The first driving voltage lines ELVDDL may be formed side by side in the second direction DR2 in the display region DA. The first driving voltage lines ELVDDL which are formed side by side in the second direction DR2 in the display region DA may be connected to each other in the non-display region NDA.

Each of the pixels PX may be connected to at least one of the scan lines SL, any one of the data lines DL, at least one of the light-emitting lines EL, and the first driving voltage line ELVDDL. In FIG. 2, an example in which each of the pixels PX is connected to two scan lines SL, 1 one data line DL, one light-emitting line EL, and the first driving voltage line ELVDDL is illustrated, but the present disclosure is not limited thereto. For example, each of the pixels PX may be connected to three scan lines SL rather than two scan lines SL.

The non-display region NDA may be defined as a region from an outer side of the display region DA to an edge of the display panel 10. That is, the non-display region NDA may be disposed to surround the display region DA, and the non-display region NDA may form a bezel.

In the non-display region NDA, a scan driving circuit 40 for applying scan signals to the scan lines SL, fan out lines FL disposed between the data lines DL and a display driving circuit 20, and pads DP connected to the display driving circuit 20 may be disposed. The display driving circuit 20 and the pads DP may be disposed on an edge of one side of the display panel 10. The pads DP may be disposed closer to the edge of one side of the display panel 10 than the display driving circuit 20.

The scan driving circuit 40 may be connected to the display driving circuit 20 through a plurality of scan control lines SCL. The scan driving circuit 40 may receive a scan control signal SCS and an emission control signal ECS from the display driving circuit 20 through the plurality of scan control lines SCL.

The scan driving circuit 40 may include a scan driver 41 and an emission control driver 42 as illustrated in FIG. 3.

The scan driver 41 may generate scan signals in response to the scan control signal SCS and sequentially output the scan signals to the scan lines SL. The emission control driver 42 may generate emission control signals in response to the emission control signal ECS and sequentially output the emission control signals to the light-emitting lines EL.

The scan driving circuit 40 may include a plurality of thin film transistors. The scan driving circuit 40 may be formed to be coplanar with the thin film transistors of the pixels PX. In FIG. 2, an example in which the scan driving circuit 40 is formed on one side of the display region DA, for example, on the non-display region NDA on a left side, is illustrated, but the present disclosure is not limited thereto. For example, the scan driving circuit 40 may be formed on both sides of the display region DA, for example, on the non-display regions NDA at left and right sides.

The display driving circuit 20 may include a timing controller 21, a data driver 22, and a power supply unit 23 as illustrated in FIG. 3.

The timing controller 21 receives digital video data DATA and timing signals from a circuit board 30. The timing controller 21 may generate a scan control signal SCS for controlling an operation timing of the scan driver 41, generate an emission control signal ECS for controlling an operation timing of the emission control driver 42, and generate a data control signal DCS for controlling an operation timing of the data driver 22 in response to the timing signals. The timing controller 21 may output the scan control signal SCS to the scan driver 41 through the plurality of scan control lines SCL and output the emission control signal ECS to the emission control driver 42. The timing controller 21 may output the digital video data DATA and the data control signal DCS to the data driver 22.

The data driver 22 converts the digital video data DATA into analog positive and negative data voltages and outputs the converted analog positive and negative data voltages to the data lines DL through the fan out lines FL. The pixels PX are selected by the scan signals of the scan driving circuit 40 and the data voltages are supplied to the selected pixels PX.

The power supply unit 23 may generate a first driving voltage and supply the first driving voltage to the first driving voltage line ELVDDL. Further, the power supply unit 23 may generate a second driving voltage and supply the second driving voltage to a second electrode (e.g., see a cathode electrode CAT of FIG. 7) of an organic light-emitting diode of each of the pixels PX. The first driving voltage may be a high potential voltage for driving the organic light-emitting diode and the second driving voltage may be a low potential voltage for driving the organic light-emitting diode. That is, the first driving voltage may have a higher potential than the second driving voltage.

The display driving circuit 20 may be formed of an integrated circuit (IC) and attached onto the display panel 10 by a chip on glass (COG) method, a chip on plastic (COP) method, or an ultrasonic bonding method, but the present disclosure is not limited thereto. For example, the display driving circuit 20 may be attached onto the circuit board 30.

The circuit board 30 may be attached onto the pads DP using an anisotropic conductive film. As a result, lead lines of the circuit board 30 may be electrically connected to the pads DP. The circuit board 30 may be a flexible printed circuit board, a printed circuit board, or a flexible film such as a chip on film.

Figure 4:
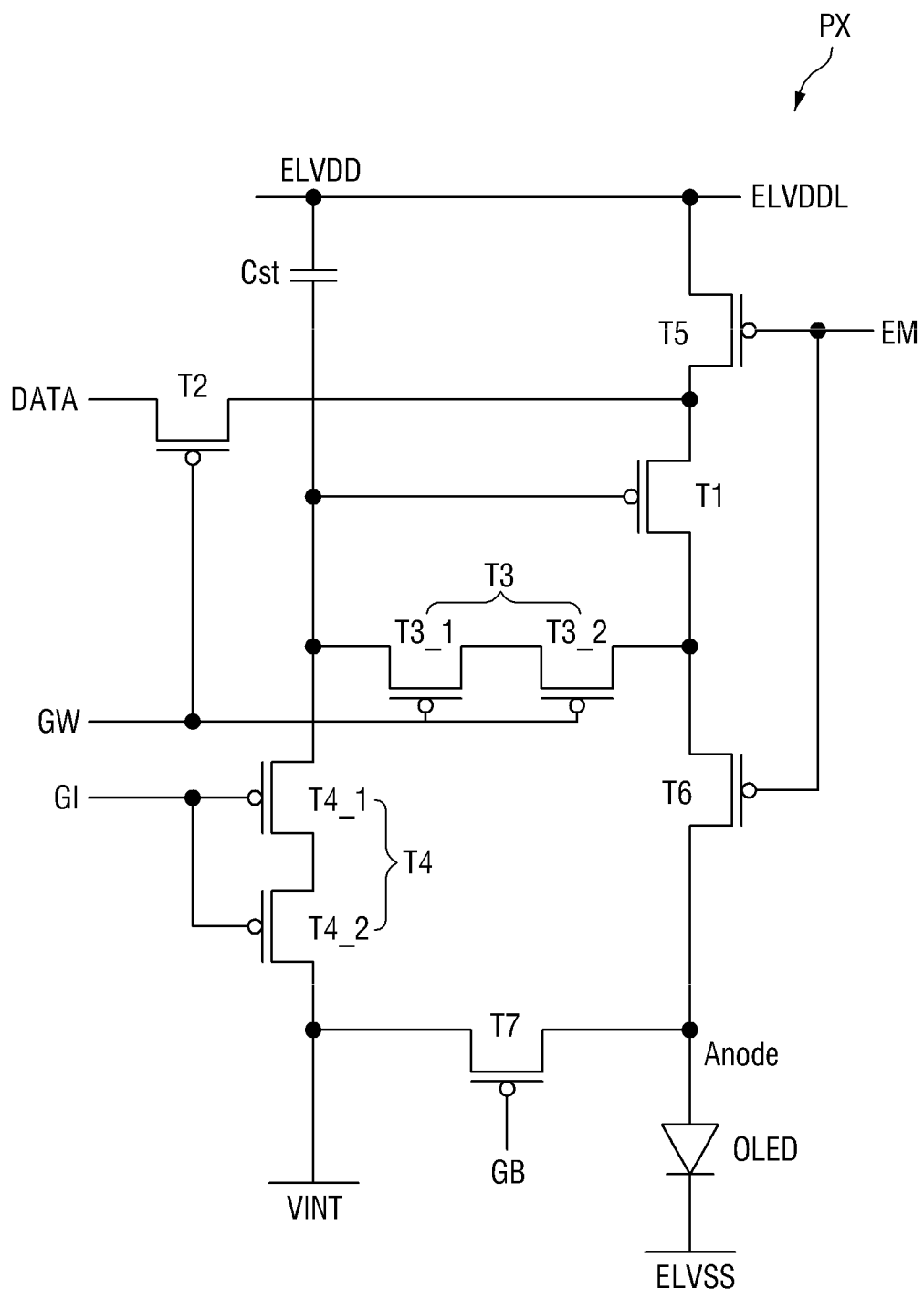
FIG. 4 is a circuit diagram illustrating one pixel in detail according to one or more embodiments of the present disclosure.

FIG. 4 is a circuit diagram illustrating one pixel in detail according to one or more embodiments of the present disclosure.

Referring to FIG. 4, a circuit of a pixel PX includes a plurality of transistors T1 to T7, a capacitor Cst, a light-emitting element (LE) or an organic light-emitting diode (OLED), and the like. In the circuit of the pixel PX, a data signal DATA, a first scan signal GW, a second scan signal GI, a third scan signal GB, an emission control signal EM, a first power voltage ELVDD, a second power voltage ELVSS, and an initialization voltage VINT are applied.

Figure 7:
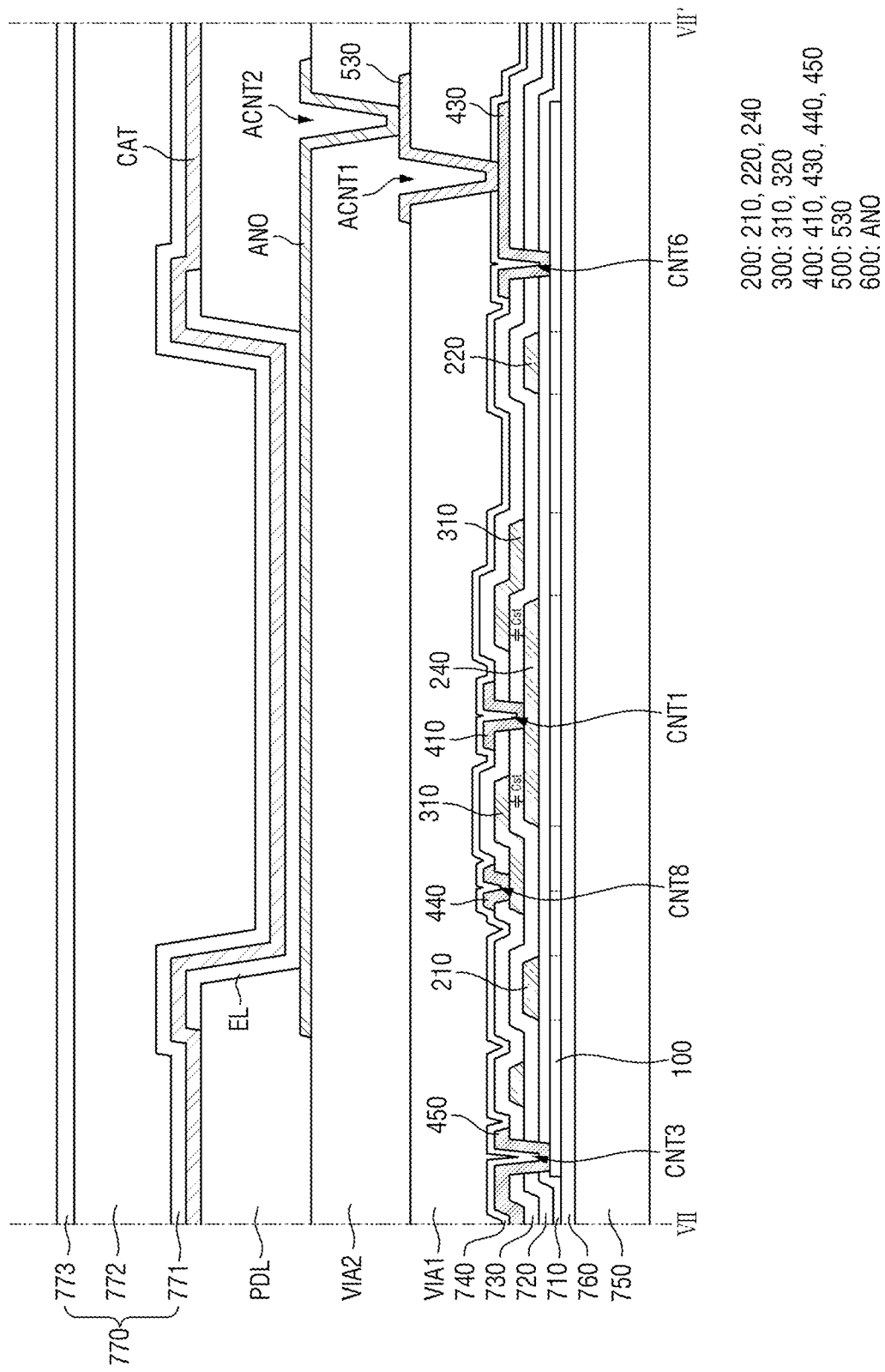
FIG. 7 is a cross-sectional view taken along line VII-VII' of FIG. 5.

The light-emitting element may be an organic light-emitting diode including a first electrode (or an anode electrode ANO of FIG. 7), an organic light-emitting layer (or a light-emitting layer EL of FIG. 7), and a second electrode (or a cathode electrode CAT of FIG. 7).

A first transistor T1 may serve as a driving transistor and second to seventh transistors T2 to T7 may serve as switching transistors. Each of the transistors T1 to T7 includes a gate electrode, a first electrode, and a second electrode. Any one of the first electrode and the second electrode of each of the transistors T1 to T7 may be a source electrode and the other one may be a drain electrode.

Each of the transistors T1 to T7 may be a thin film transistor. Each of the transistors T1 to T7 may be any one of a p-type metal-oxide-semiconductor (PMOS) transistor and an n-type metal-oxide-semiconductor (NMOS) transistor. In one or more embodiments, the first transistor T1 serving as a driving transistor, the second transistor T2 serving as a data transfer transistor, the third transistor T3 serving as a compensation transistor, the fourth transistor T4 serving as a first initialization transistor, the fifth transistor T5 serving as a first emission control transistor, the sixth transistor T6 serving as a second emission control transistor, and the seventh transistor T7 serving as a second initialization transistor are all PMOS transistors.

Hereinafter, each component will be described in detail.

The gate electrode of the first transistor T1 is connected to a first electrode of the capacitor Cst. The first electrode of the first transistor T1 is connected to a terminal of the first power voltage ELVDD via the fifth transistor T5. The second electrode of the first transistor T1 is connected to an anode electrode of an organic light-emitting diode OLED via the sixth transistor T6. The first transistor T1 receives the data signal DATA and supplies a driving current Id to the organic light-emitting diode OLED according to a switching operation of the second transistor T2.

The first transistor T1 controls a current Ids (hereinafter, referred to as "a driving current"), which flows between a drain and a source, according to a data voltage applied to the gate electrode. The driving current Ids which flows through a channel of the first transistor T1 may be proportional to a square of a difference between a voltage Vgs between the gate electrode and the source electrode of the first transistor T1 and a threshold voltage, as Equation 1.

$$Ids = k' \times (Vgs - Vth)^2 \qquad \text{[Equation 1]}$$

In Equation 1, k' denotes a proportional coefficient determined by a structure and physical characteristics of the driving transistor, Vgs denotes a voltage between the drain and the source of the driving transistor, and Vth denotes a threshold voltage of the driving transistor.

The gate electrode of the second transistor T2 is connected to a terminal of the first scan signal GW. The first electrode of the second transistor T2 is connected to a terminal of the data signal DATA. The second electrode of the second transistor T2 is connected to the terminal of the first power voltage ELVDD via the fifth transistor T5 while being connected to the first electrode of the first transistor T1. The second transistor T2 is turned on in response to the first scan signal GW to perform a switching operation of transmitting the data signal DATA to the first electrode of the first transistor T1.

The third transistor T3 may be formed as a dual transistor including a $3^{rd}$-1 transistor T3_1 and a $3^{rd}$-2 transistor T3_2. A gate electrode of the $3^{rd}$-1 transistor T3_1 is connected to the terminal of the first scan signal GW, a first electrode of the $3^{rd}$-1 transistor T3_1 is connected to a second electrode of the $3^{rd}$-2 transistor T3_2, and a second electrode of the $3^{rd}$-1 transistor T3_1 is connected to the first electrode of the capacitor Cst, a first electrode of a $4^{th}$-1 transistor T4_1, and the gate electrode of the first transistor T1. A gate electrode of the $3^{rd}$-2 transistor T3_2 may be connected to the terminal of the first scan signal GW, the first electrode of the $3^{rd}$-2 transistor T3_2 may be connected to the second electrode of the first transistor T1, and the second electrode of the $3^{rd}$-2 transistor T3_2 may be connected to the first electrode of the $3^{rd}$-1 transistor T3_1.

The $3^{rd}$-1 transistor T3_1 and the $3^{rd}$-2 transistor T3_2 are turned on by the first scan signal GW and connect the gate electrode and the second electrode of the first transistor T1 to diode-connect the first transistor T1. Accordingly, a voltage difference may be generated between the first electrode and the gate electrode of the first transistor T1 by a threshold voltage of the first transistor T1, and a deviation of the threshold voltage of the first transistor T1 may be compensated for by supplying the data signal DATA of which a threshold voltage is compensated for to the gate electrode of the first transistor T1.

The fourth transistor T4 may be formed as a dual transistor including a $4^{th}$-1 transistor T4_1 and a $4^{th}$-2 transistor T4_2. A gate electrode of the 4$^{th}$-1 transistor T4_1 may be connected to a terminal of the second scan signal GI, a first electrode of the 4$^{th}$-1 transistor T4_1 may be connected to the first electrode of the capacitor Cst, the second electrode of the 3$^{rd}$-1 transistor T3_1, and the gate electrode of the first transistor T1, and a second electrode of the 4$^{th}$-1 transistor T4_1 may be connected to the first electrode of the 4$^{th}$-2 transistor T4_2. The gate electrode of the 4$^{th}$-2 transistor T4_2 may be connected to the terminal of the second scan signal GI, the first electrode of the 4$^{th}$-2 transistor T4_2 may be connected to the second electrode of the 4$^{th}$-1 transistor T4_1, and a second electrode of the 4$^{th}$-2 transistor T4_2 may be connected to the initialization voltage VINT. The 4$^{th}$-1 transistor T4_1 and the 4$^{th}$-2 transistor T4_2 are turned on by the second scan signal GI to perform an operation of initializing the voltage of the gate electrode of the first transistor T1 by transmitting the initialization voltage VINT to the gate electrode of the first transistor T1.

The gate electrode of the fifth transistor T5 is connected to a terminal of the emission control signal EM, the first electrode of the fifth transistor T5 is connected to the first driving voltage line ELVDDL, and the second electrode of the fifth transistor T5 is connected to the first electrode of the first transistor T1. The fifth transistor T5 is turned on by the emission control signal EM to connect the first electrode of the first transistor T1 to the first driving voltage line ELVDDL.

The sixth transistor T6 is disposed between (e.g., electrically connected between) the second electrode of the first transistor T1 and the first electrode of the light-emitting element LE or organic light-emitting diode OLED. The gate electrode of the sixth transistor T6 is connected to the terminal of the emission control signal EM, the first electrode of the sixth transistor T6 is connected to the second electrode of the first transistor T1 and the first electrode of the 3$^{rd}$-2 transistor T3_2, and the second electrode of the sixth transistor T6 is connected to the first electrode of the light-emitting element LE or organic light-emitting diode OLED.

The fifth transistor T5 and the sixth transistor T6 are concurrently (e.g., simultaneously) turned on in response to the emission control signal EM, and accordingly, the driving current Id flows into the organic light-emitting diode OLED.

The gate electrode of the seventh transistor T7 is connected to a terminal of the third scan signal GB. The first electrode of the seventh transistor T7 is connected to the anode electrode of the organic light-emitting diode OLED. The second electrode of the seventh transistor T7 is connected to a terminal of the initialization voltage VINT. The seventh transistor T7 is turned on in response to the third scan signal GB to initialize the anode electrode of the organic light-emitting diode OLED.

As shown in FIG. 4, an example in which the gate electrode of the seventh transistor T7 receives the third scan signal GB is illustrated. However, in one or more embodiments, the circuit of the pixel PX may be configured such that the gate electrode of the seventh transistor T7 receives the emission control signal EM.

The capacitor Cst is formed between (e.g., electrically connected between) the gate electrode of the first transistor T1 and the first driving voltage line ELVDDL and includes a first electrode and a second electrode. The first electrode of the capacitor Cst may be connected to the gate electrode of the first transistor T1, the second electrode of the third transistor T3, and the first electrode of the fourth transistor T4, and the second electrode of the capacitor Cst may be connected to the first driving voltage line ELVDDL. The capacitor Cst may serve to maintain the data voltage applied to the gate electrode of the first transistor T1 to be constant.

The cathode electrode of the LE is connected to a terminal of the second power voltage ELVSS. The LE receives the driving current Id from the first transistor T1 and emits light to display an image.

Hereinafter, a planar arrangement and cross-sectional structure of the pixel PX described above will be described in detail.

Figure 5:
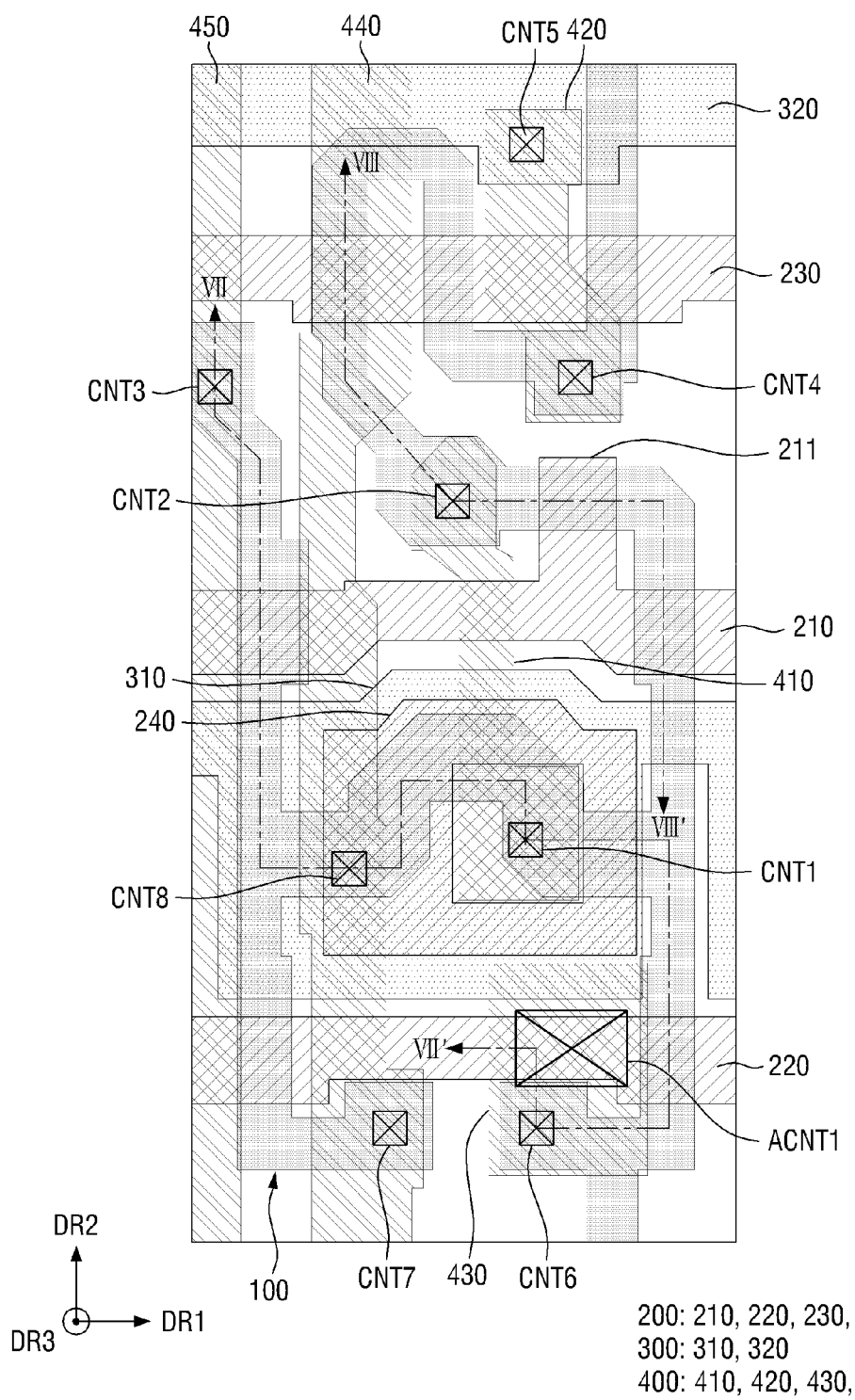
FIG. 5 is a layout of a pixel of a display device according to one or more embodiments of the present disclosure.
Figure 6:
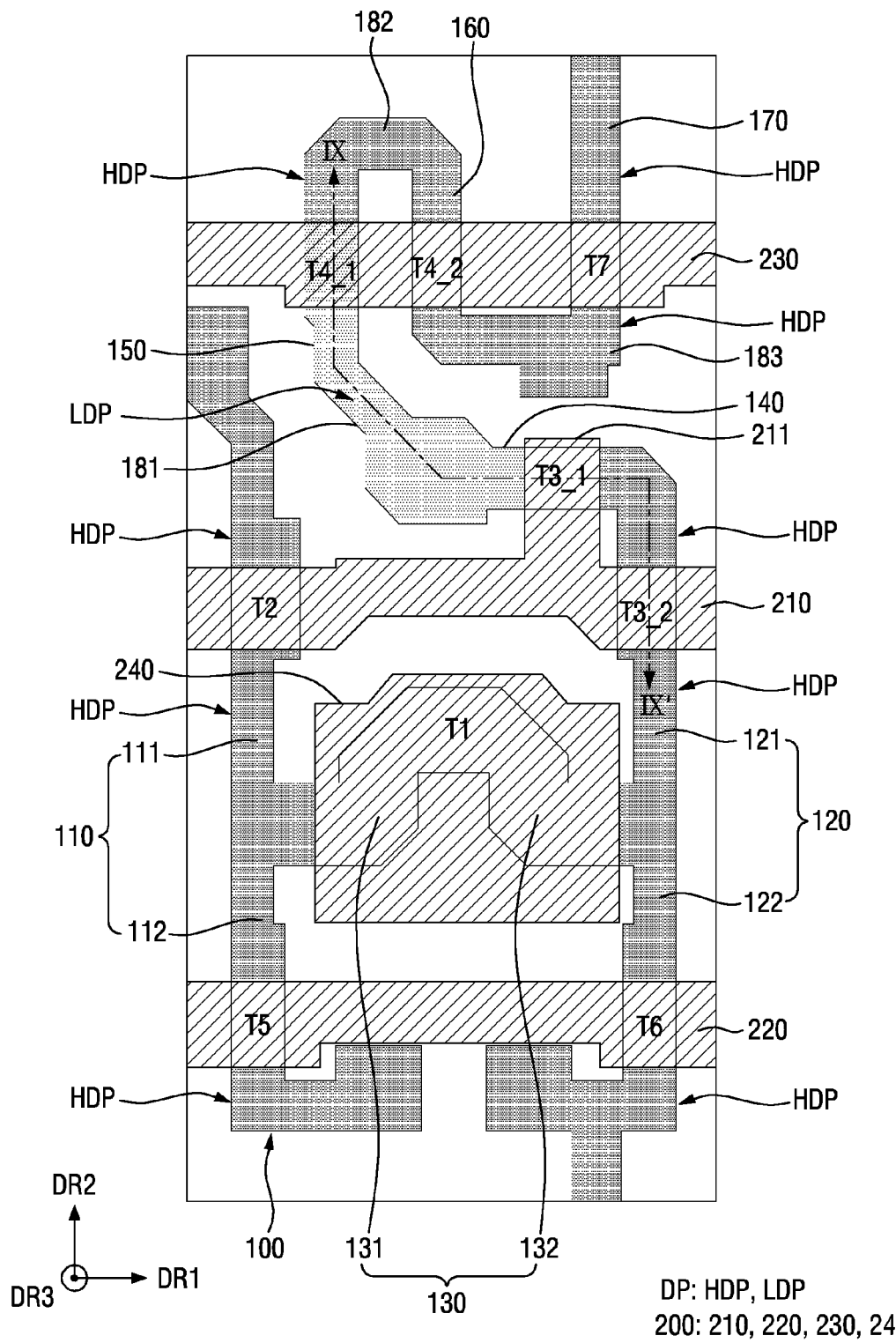
FIG. 6 is a layout of a semiconductor layer and a first conductive layer of FIG. 5.
Figure 8:
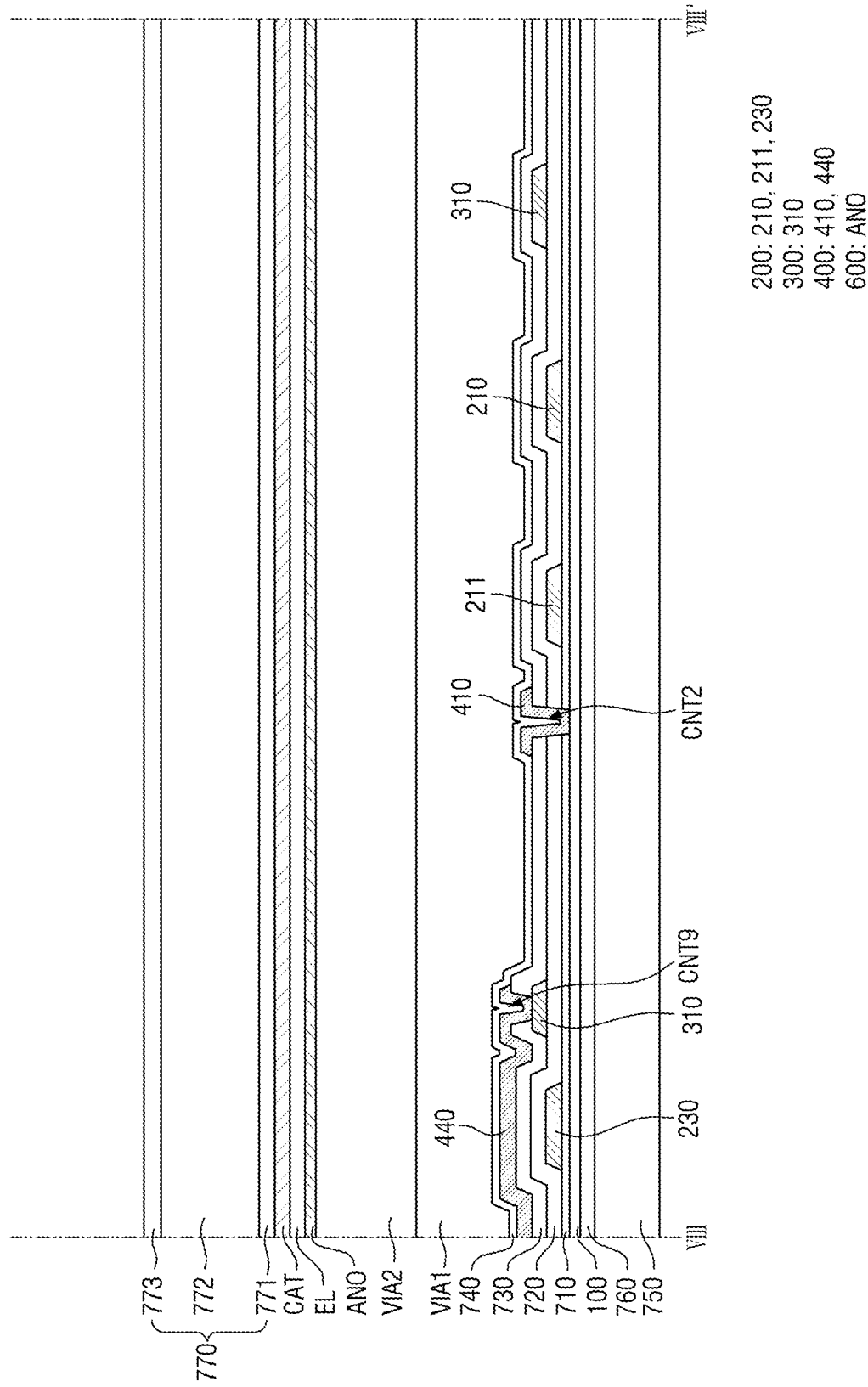
FIG. 8 is a cross-sectional view taken along line VIII-VIII' of FIG. 5.
Figure 9:
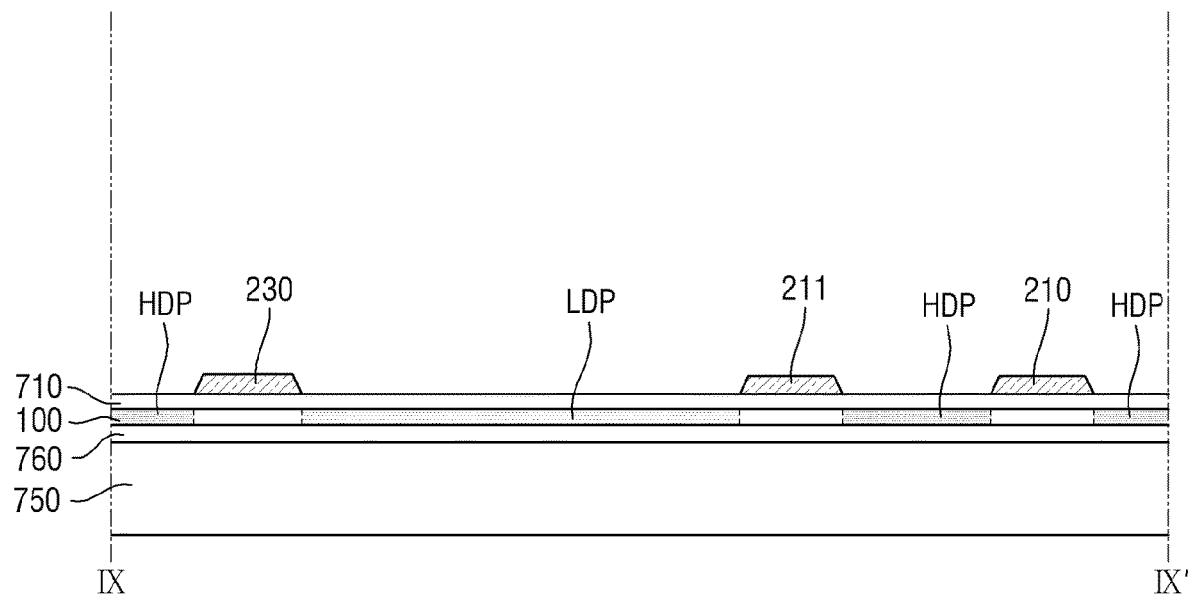
FIG. 9 is a cross-sectional view taken along line IX-IX' of FIG. 6.

FIG. 5 is a layout of a pixel of a display device according to one or more embodiments of the present disclosure. FIG. 6 is a layout of a semiconductor layer and a first conductive layer of FIG. 5. FIG. 7 is a cross-sectional view taken along line VII-VII' of FIG. 5. FIG. 8 is a cross-sectional view taken along line VIII-VIII' of FIG. 5. FIG. 9 is a cross-sectional view taken along line IX-IX' of FIG. 6.

In the following embodiment, some components have been given new reference numerals to easily explain the arrangement and coupling relationship between the components even though the components are substantially the same as those mentioned in FIGS. 1-4.

Referring to FIGS. 5-9, as described above, a pixel PX includes a plurality of transistors T1 to T7, a capacitor Cst (e.g., see FIG. 2 and hereinafter the same), and an organic light-emitting diode OLED (e.g., see FIG. 2 and hereinafter the same).

The capacitor Cst includes conductive layers forming an electrode and an insulating layer disposed between the conductive layers. The organic light-emitting diode OLED includes a conductive layer forming an anode electrode and a cathode electrode and an organic light-emitting layer disposed between the anode electrode and the cathode electrode. Electrical connection of the elements may be made by lines formed of a conductive layer and/or vias formed of a conductive material. The conductive material or the conductive layer described above, a semiconductor layer, an insulating layer, an organic light-emitting layer, and the like are disposed on a substrate 750.

In one or more embodiments, layers of the pixel PX may be disposed in an order of the substrate 750, a buffer layer 760, a semiconductor layer 100, a first insulating layer 710, a first conductive layer 200, a second insulating layer 720, a second conductive layer 300, a third insulating layer 730, a third conductive layer 400, a protective layer 740, a first via layer VIA1, a fourth conductive layer 500, a second via layer VIA2, a fifth conductive layer 600, a pixel definition film PDL, an organic light-emitting layer EL, and a cathode electrode CAT. Each of the above-described layers may be formed as a single film or may be formed as a stacked film including a plurality of films. Another layer may be further disposed between the layers.

The substrate 750 supports the respective layers disposed thereabove. When an organic light-emitting display device is a backside or double-sided emission type, a transparent substrate may be used. When the organic light-emitting display device is a top emission type, not only a transparent substrate but also a translucent or opaque substrate may be used.

The substrate 750 may be made of, for example, an insulating material such as glass, quartz, a polymer resin, or the like. Examples of the polymer material may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination thereof. The substrate 750 may include a metal material.

The substrate 750 may be a rigid substrate or a flexible substrate which is bendable, foldable, or rollable. An example of the material forming the flexible substrate may include PI, but the present disclosure is not limited thereto.

The buffer layer 760 may be disposed on an entire surface of the substrate 750. The buffer layer 760 may prevent or reduce the diffusion of impurity ions, prevent or reduce the penetration of moisture or external air, and perform a surface planarization function. The buffer layer 760 may include silicon nitride, silicon oxide, silicon oxynitride, or the like. The buffer layer 760 may be omitted in one or more embodiments according to a type of the substrate 750, process conditions, or the like.

The semiconductor layer 100 is an active layer that forms a first region, a second region, and a channel (or a channel region) which are in contact with a first electrode and a second electrode of each of the first to seventh transistors T1 to T7. Any one of the first region and the second region becomes a source region and the other one becomes a drain region.

Hereinafter, in the plan view, a right side is referred to as one side in a first direction DR1, a left side is referred to as the other side in the first direction DR1, an upper side is referred to as one side in a second direction DR2, and a lower side is referred to as the other side in the second direction DR2.

The semiconductor layers 100 in each pixel PX may be connected without being separated from each other. The semiconductor layer 100 may have a specific pattern in the plan view. For example, the semiconductor layer 100 may include a first vertical portion 110, a second vertical portion 120, a third vertical portion 150, a fourth vertical portion 160, and a fifth vertical portion 170, which generally extend (or extend substantially) in the second direction DR2, a first horizontal portion 130 and a second horizontal portion 140, which generally extend (or extend substantially) in the first direction DR1, and first to third connection portions 181, 182, and 183, which connect some of the plurality of vertical portions 110, 120, 150, 160, and 170 and some of the plurality of horizontal portions 130 and 140. The plurality of vertical portions 110, 120, 150, 160, and 170, the plurality of horizontal portions 130 and 140, and the first to third connection portions 181, 182, and 183 may be physically connected to each other.

The first vertical portion 110 may be disposed adjacent to the other side of the pixel PX in the first direction DR1, and the second vertical portion 120 may be disposed adjacent to one side of the pixel PX in the first direction DR1. The first vertical portion 110 and the second vertical portion 120 may be disposed to be spaced apart from each other. A length of the first vertical portion 110 in the second direction DR2 may be greater than that of the second vertical portion 120 in the second direction DR2. The first horizontal portion 130 may connect an intermediate portion of the first vertical portion 110 to an intermediate portion of the second vertical portion 120. In this specification, each of an upper portion 111 of the first vertical portion 110 and an upper portion 121 of the second vertical portion 120 may be referred to as a portion located closer to one side in the second direction DR2 than a portion connected to the first horizontal portion 130 in the plan view, and each of a lower portion 112 of the first vertical portion 110 and a lower portion 122 of the second vertical portion 120 may be referred to as a portion located closer to the other side in the second direction DR2 than the portion connected to the first horizontal portion 130 in the plan view. Planar shapes of the first vertical portion 110, the second vertical portion 120, and the first horizontal portion 130 may be substantially similar to an H shape.

In one or more embodiments, the first horizontal portion 130 may connect the first vertical portion 110 to the second vertical portion 120 at the shortest distance (e.g., connect the first vertical portion 110 to the second vertical portion 120 without bends). However, as illustrated in FIG. 6, the first horizontal portion 130 may include a first bent portion 131 located on the other side in the first direction DR1 and a second bent portion 132 located on one side in the first direction DR1. A total length of the first horizontal portion 130 may be increased by bending a plurality of times.

The second horizontal portion 140 may extend from an end of one side of the upper portion 121 of the second vertical portion 120 in the second direction DR2 to the other side thereof in the first direction DR1 and may be disposed closer to one side in the second direction DR2 than the first horizontal portion 130. A region of the other side of the second horizontal portion 140 in the first direction DR1 may have a greater width than the other region in the second direction DR2, but the present disclosure is not limited thereto.

The third vertical portion 150, the fourth vertical portion 160, and the fifth vertical portion 170 may be disposed on one side of the second horizontal portion 140 in the second direction DR2. The third vertical portion 150 may be disposed on the other side of the fifth vertical portion 170 in the second direction DR2, and the fourth vertical portion 160 may be disposed between the third vertical portion 150 and the fifth vertical portion 170 (e.g., in a plan view as shown in FIG. 6). An end of the other side of the fourth vertical portion 160 in the second direction DR2 may be connected to the fourth vertical portion 160, and an end of one side of the fourth vertical portion 160 in the second direction DR2 may be connected to a lower portion 122 of a second vertical portion 120 of another pixel PX adjacent to the pixel PX.

A first connection portion 181 may be disposed between (e.g., electrically connected between) an end of the other side of the second horizontal portion 140 in the first direction DR1 and an end of the other side of the third vertical portion 150 in the second direction DR2. The first connection portion 181 may connect the second horizontal portion 140 to the third vertical portion 150 and may be formed to be inclined in the first direction DR1 and the second direction DR2.

A second connection portion 182 may be disposed between (e.g., electrically connected between) an end of one side of the third vertical portion 150 in the second direction DR2 and an end of one side of the fourth vertical portion 160 in the second direction DR2. The second connection portion 182 may connect the third vertical portion 150 to the fourth vertical portion 160.

A third connection portion 183 may be disposed between (e.g., electrically connected between) an end of the other side of the fourth vertical portion 160 in the second direction DR2 and an end of the other side of the fifth vertical portion 170 in the second direction DR2. The third connection portion 183 may connect the fourth vertical portion 160 to the fifth vertical portion 170.

Planar shapes of the third vertical portion 150, the fourth vertical portion 160, the fifth vertical portion 170, the second connection portion 182, and the third connection portion 183 may be similar to an S shape substantially lying inverted.

A channel of the second transistor T2 may be disposed on the upper portion 111 of the first vertical portion 110, and a channel of the fifth transistor T5 may be disposed on the lower portion 112 of the first vertical portion 110. A channel of the $3^{rd}$-2 transistor T3_2 may be disposed on the upper portion 121 of the second vertical portion 120. The channel of the first transistor T1 may be disposed on the first horizontal portion 130. A channel of the $3^{rd}$-1 transistor T3_1 may be disposed on the second horizontal portion 140. A channel of the $4^{th}$-1 transistor T4_1 may be disposed on the third vertical portion 150, and a channel of the $4^{th}$-2 transistor T4_2 may be disposed on the fourth vertical portion 160. A channel of the seventh transistor T7 may be disposed on the fifth vertical portion 170.

The semiconductor layer 100 may include polycrystalline silicon. The polycrystalline silicon may be formed by crystallizing amorphous silicon. Examples of a crystallization method may include a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, or the like, but the present disclosure is not limited thereto. As another example, the semiconductor layer 100 may include single crystalline silicon, low temperature polycrystalline silicon, amorphous silicon, or the like.

In the semiconductor layer 100, impurity ions (e.g., p-type impurity ions in the case of a PMOS transistor) may be doped in portions (a first region and a second region) which are connected to the first electrode and the second electrode of each of the transistors T1 to T7. Trivalent dopants such as boron (B) may be used as the p-type impurity ions. In other words, in the semiconductor layer 100, a portion which does not overlap the first scan line 210, the emission control line 220, and the second scan line 230 may be referred to as a non-overlapping region DP, and the non-overlapping region DP may be a region doped with impurity ions.

Hereinafter, the doping impurity ion is described as being boron (B), but the present disclosure is not limited thereto. When at least some of the transistors T1 to T7 are NMOS transistors, n-type impurity ions may be doped, and pentavalent dopants such as phosphorus (P) may be used as the n-type impurity ions. Even when a dopant is an n-type impurity ion, all of the contents described below may be applied.

The non-overlapping region DP of the semiconductor layer 100 may include a first doped region LDP and a second doped region HDP.

The first doped region LDP may be a portion of the semiconductor layer 100 which is disposed between the gate electrode of the $3^{rd}$-1 transistor T3_1 and the $4^{th}$-1 transistor T4_1. In other words, the first doped region LDP may include a portion of the second horizontal portion 140 which is disposed on the other side of a portion in which the second horizontal portion 140 overlaps a first scan line protrusion 211 in the first direction DR1 and a portion of the third vertical portion 150 which is disposed on the other side of a portion in which the first connection portion 181 and the third vertical portion 150 overlap the second scan line 230 in the second direction DR2. The first doped region LDP may include the second region of the $3^{rd}$-1 transistor T3_1.

The second doped region HDP may be a portion of the non-overlapping region DP except for the first doped region LDP and may occupy most of the non-overlapping region DP.

The first doped region LDP and the second doped region HDP may be doped with the same impurity ions. However, concentrations of the two regions doped with the impurity ions may be different. The first doped region LDP may be a region doped with impurity ions having a lower concentration than the second doped region HDP. Although the concentration of the impurity ions doped in the first doped region LDP is different from the concentration of the impurity ions doped in the second doped region HDP, the concentrations of the impurity ions doped in the first doped region LDP and the second doped region HDP may be substantially uniform over entire regions of the first doped region LDP and the second doped region HDP. In other words, the concentration of the impurity ions doped in the first doped region LDP may be entirely uniform or substantially uniform in the first doped region LDP, and the concentration of the impurity ions doped in the second doped region HDP may be entirely uniform or substantially uniform in the second doped region HDP.

In one or more embodiments, the concentration of the impurity ions doped in the first doped region LDP may range from about $5E14/cm^3$ to about $2E15/cm^3$, and concentration of the impurity ions doped in the second doped region HDP may range from about $1E15/cm^3$ to about $4E15/cm^3$. However, the doping concentrations of the impurity ions are not limited thereto. The concentration of the impurity ions doped in the first doped region LDP may be about ¾ or less of the concentration of the impurity ions doped in the second doped region HDP. Further, the concentration of the impurity ions doped in the first doped region LDP may be smaller (or lesser) than the concentration of the impurity ions doped in the second doped region HDP but may be greater than a concentration of impurity ions of the channel of each of the transistors T1 to T7.

The impurity ions doped in the first doped region LDP and the impurity ions doped in the second doped region HDP may be identical to each other, but electrical resistance of the first doped region LDP may be greater than electrical resistance of the second doped region HDP.

The second region of the $3^{rd}$-1 transistor T3_1 and the first region of the $3^{rd}$-2 transistor T3_2 may be doped with impurity ions having different concentrations, and the concentrations of the impurity ions doped in the two regions may be asymmetric with each other. The concentration of the impurity ions doped in the second region of the $3^{rd}$-1 transistor T3_1 may be lower than the concentration of the impurity ions doped in the first region of the $3^{rd}$-2 transistor T3_2. That is, even in one transistor (e.g., the third transistor T3), the concentration of the impurity ions doped in the first region (e.g., the first region of the $3^{rd}$-2 transistor T3_2) of the corresponding transistor and the concentration of the impurity ions doped in the second region (e.g., the second region of the $3^{rd}$-1 transistor T3_1) may be different from each other, and the concentration of the impurity ions doped in the second region may be lower than the concentration of the impurity ions doped in the first region. In one or more embodiments, the concentration of impurity ions doped in the first region and the concentration of impurity ions doped in the second region are measured or determined at corresponding locations. For example, the first region and the second region may include a source region and a drain region respectively and an upper portion of the first region may correspond to an upper portion of the second region with respect to the channel.

The second region having a low concentration of doped impurity ions may have higher electrical resistance than the first region having a high concentration of doped impurity ions. In this case, a leakage current due to a gate induced drain leakage (GIDL) may be reduced in an off region without supplying a separate voltage to any one of the first electrode and the second electrode, which is a drain electrode of one transistor.

More specifically, a current may enter a source electrode of a first electrode and a second electrode of one transistor and flow into a drain electrode, which is the other one of the first electrode and the second electrode, through the source region among the first region and the second region which is in contact with the source electrode of the semiconductor layer 100, the channel, and the drain region which is the other one of the first region and the second region. The current does not flow in the off region in which no voltage is applied to the gate electrode.

However, even in the off region in which no voltage is applied to the gate electrode of the transistor, an unintended current (hereinafter, referred to as a "leakage current") may flow therein. Impurity ions having a relatively low concentration may be doped in the drain region of the transistor, and the drain region may have impurity ions having a lower concentration than the source region, and thus the drain region may have higher electrical resistance than the source region. Therefore, even when the leakage current is generated, the electrical resistance may be increased by reducing the doping concentration in the drain region, and even when a separate voltage is not applied to the drain electrode connected to the drain region, the leakage current passing through the drain region may be reduced.

In one or more embodiments, the first doped region LDP may include a second region (or the second region of the $3^{rd}$-1 transistor T3_1) of the third transistor, and the second region may have higher electrical resistance than the other portion of the semiconductor layer 100. The leakage current may flow from the first region (or the first region of the $3^{rd}$-2 transistor T3_2) of the third transistor into the second region of the third transistor. The third transistor T3 may not be directly connected to a voltage terminal which applies a voltage. In this case, because the doping concentration in the second region is relatively low and the electrical resistance is large, the leakage current may be suppressed or prevented even when a separate voltage is not applied to any one of the first electrode and the second electrode connected to the second region.

Accordingly, an increase in power consumption due to the leakage current, staining of the panel, flicker, and the like may be prevented or reduced, and the display device may be smoothly operated.

The first insulating layer 710 may be disposed on the semiconductor layer 100 and may be generally disposed (or disposed substantially) over an entire surface of the substrate 750. The first insulating layer 710 may be a gate insulating film having a gate insulating function.

The first insulating layer 710 may include a silicon compound, a metal oxide, or the like. For example, the first insulating layer 710 may include silicon oxide, silicon nitride, silicon oxynitride, aluminum oxide, tantalum oxide, hafnium oxide, zirconium oxide, titanium oxide, or the like. The above materials may be used alone or in combinations thereof.

The first conductive layer 200 is disposed on the first insulating layer 710. The first conductive layer 200 may include a first scan line 210 which transmits a first scan signal GW (e.g., see FIG. 4 and hereinafter the same), a gate electrode 240 of the first transistor T1, an emission control line 220 which transmits an emission control signal EM (e.g., see FIG. 4 and hereinafter the same), and a second scan line 230 which supplies a second scan signal GI (e.g., see FIG. 4 and hereinafter the same).

The first scan line 210 may include a second transistor T2, a $3^{rd}$-1 transistor T3_1, and a gate electrode of a $3^{rd}$-2 transistor T3_2, and the emission control line 220 may include a gate electrode of the fifth transistor T5 and a gate electrode of the sixth transistor T6. Further, the second scan line 230 may include a $4^{th}$-1 transistor T4_1, a $4^{th}$-2 transistor T4_2, and a gate electrode of the seventh transistor T7.

Each of the first scan line 210, the emission control line 220, and the second scan line 230 may extend along the first direction DR1. Each of the first scan line 210, the emission control line 220, and the second scan line 230 may extend to a neighboring pixel PX beyond a boundary of the pixel PX along the first direction DR1.

The first scan line 210 may be located near the center of the pixel PX and may overlap the upper portion 111 of the first vertical portion 110 and the upper portion 121 of the second vertical portion 120 of the semiconductor layer 100.

The first scan line 210 may form the gate electrode of the second transistor T2 in a portion which overlaps the upper portion 111 of the first vertical portion 110 of the semiconductor layer 100. The first vertical portion 110 of the semiconductor layer 100 located closer to one side in the second direction DR2 relative to the overlapping region may be the first region of the second transistor T2, and the first vertical portion 110 of the semiconductor layer 100 located closer to the other side in the second direction DR2 relative to the overlapping region may be the second region of the second transistor T2.

The first scan line 210 may form the gate electrode of the $3^{rd}$-2 transistor T3_2 in a portion which overlaps the upper portion 121 of the second vertical portion 120 of the semiconductor layer 100. The second vertical portion 120 of the semiconductor layer 100 located closer to one side in the second direction DR2 relative to the overlapping region may be the second region of the $3^{rd}$-2 transistor T3_2, and the second vertical portion 120 of the semiconductor layer 100 located closer to the other side in the second direction DR2 relative to the overlapping region may be the first region of the $3^{rd}$-2 transistor T3_2.

The first scan line 210 may further include a first scan line protrusion 211. The first scan line protrusion 211 may protrude from the first scan line 210 extending in the first direction DR1 toward one side in the second direction DR2.

The first scan line protrusion 211 may overlap the second horizontal portion 140 of the semiconductor layer 100 and form the gate electrode of the $3^{rd}$-1 transistor T3_1 in the corresponding overlapping portion. The second horizontal portion 140 of the semiconductor layer 100 located closer to one side in the first direction DR1 relative to the overlapping region may be the first region of the $3^{rd}$-1 transistor T3_1, and the second horizontal portion 140 of the semiconductor layer 100 located closer to the other side in the first direction DR1 relative to the overlapping region may be the second region of the $3^{rd}$-1 transistor T3_1.

The emission control line 220 may be located on the other side of the pixel PX in the second direction DR2 in the plan view and overlap the lower portion 112 of the first vertical portion 110 and the lower portion 122 of the second vertical portion 120 of the semiconductor layer 100.

The emission control line 220 may form the gate electrode of the fifth transistor T5 in a portion which overlaps the lower portion 112 of the first vertical portion 110 of the semiconductor layer 100. The first vertical portion 110 of the semiconductor layer 100 located closer to one side in the second direction DR2 relative to the overlapping region may be the second region of the fifth transistor T5, and the first vertical portion 110 of the semiconductor layer 100 located closer to the other side in the second direction DR2 relative to the overlapping region may be the first region of the fifth transistor T5.

The emission control line 220 may form the gate electrode of the sixth transistor T6 in a portion which overlaps the upper portion 121 of the second vertical portion 120. The second vertical portion 120 of the semiconductor layer 100 located closer to one side in the second direction DR2 relative to the overlapping region may be the first region of the sixth transistor T6, and the second vertical portion 120 of the semiconductor layer 100 located closer to the other side in the second direction DR2 relative to the overlapping region may be the second region of the sixth transistor T6.

The second scan line 230 may be located on one side of the pixel PX in the second direction DR2 in the plan view and overlap the third vertical portion 150, the fourth vertical portion 160, and the fifth vertical portion 170 of the semiconductor layer 100.

The second scan line 230 may form the gate electrode of the $4^{th}$-1 transistor T4_1 in a portion which overlaps the third vertical portion 150 of the semiconductor layer 100. The third vertical portion 150 of the semiconductor layer 100 located closer to one side in the second direction DR2 relative to the overlapping region may be the second region of the $4^{th}$-1 transistor T4_1, and the third vertical portion 150 of the semiconductor layer 100 located closer to the other side in the second direction DR2 relative to the overlapping region may be the first region of the $4^{th}$-1 transistor T4_1.

The second scan line 230 may form the gate electrode of the $4^{th}$-2 transistor T4_2 in a portion which overlaps the fourth vertical portion 160 of the semiconductor layer 100. The fourth vertical portion 160 of the semiconductor layer 100 located closer to one side in the second direction DR2 relative to the overlapping region may be the first region of the $4^{th}$-2 transistor T4_2, and the fourth vertical portion 160 of the semiconductor layer 100 located closer to the other side in the second direction DR2 relative to the overlapping region may be the second region of the $4^{th}$-2 transistor T4_2.

The second scan line 230 may form the gate electrode of the seventh transistor T7 in a portion which overlaps the fifth vertical portion 170 of the semiconductor layer 100. The fifth vertical portion 170 of the semiconductor layer 100 located closer to one side in the second direction DR2 relative to the overlapping region may be the second region of the seventh transistor T7, and the fifth vertical portion 170 of the semiconductor layer 100 located closer to the other side in the second direction DR2 relative to the overlapping region may be the first region of the seventh transistor T7.

The gate electrodes of the second to seventh transistors T2 to T7 may have widths greater than widths of the peripheral lines in the corresponding portions, but the present disclosure is not limited thereto.

The gate electrode 240 of the first transistor T1 may be located in a central portion of the pixel PX. The gate electrode 240 of the first transistor T1 may be located between the first scan line 210 and the emission control line 220 in the plan view. The gate electrodes 240 of the first transistor T1 in each pixel PX may be separated from each other.

The gate electrode 240 of the first transistor T1 overlaps the first horizontal portion 130 of the semiconductor layer 100. The first horizontal portion 130 of the semiconductor layer 100 located closer to the other side in the first direction DR1 relative to the overlapping portion may be the first region of the first transistor T1, and the first horizontal portion 130 of the semiconductor layer 100 located closer to one side in the first direction DR1 relative to the overlapping region may be the second region of the first transistor T1.

The first conductive layer 200 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (T1), tantalum (Ta), tungsten (W), and copper (Cu).

The second insulating layer 720 serves to insulate the first conductive layer 200 from the second conductive layer 300. The second insulating layer 720 may be disposed on the first conductive layer 200 and may be generally disposed (or disposed substantially) over an entire surface of the substrate 750. The second insulating layer 720 may be an interlayer insulating film.

The second insulating layer 720 may include an inorganic insulating material, such as silicon oxide, silicon nitride, silicon oxynitride, hafnium oxide, aluminum oxide, titanium oxide, tantalum oxide, zinc oxide, or the like, or an organic insulating material such as a polyacrylate resin, an epoxy resin, a phenolic resin, a polyamide resin, a polyimide resin, an unsaturated polyester resin, a poly phenylen ether resin, a polyphenylene sulfides resin, benzocyclobutene (BCB), and/or the like. The second insulating layer 720 may be a single film or a multilayer film formed as a stacked film of different materials.

The second conductive layer 300 is disposed on the second insulating layer 720. The second conductive layer 300 may include a capacitor electrode line 310 and an initialization voltage line 320 for supplying an initialization voltage VINT (e.g., see FIG. 4 and hereinafter the same).

Each of the capacitor electrode line 310 and the initialization voltage line 320 may extend along the first direction DR1. Each of the capacitor electrode line 310 and the initialization voltage line 320 may extend to a neighboring pixel PX beyond the boundary of the pixel PX along the first direction DR1.

The capacitor electrode line 310 crosses the central portion of the pixel PX and is disposed to overlap the gate electrode 240 of the first transistor T1 therebelow with the second insulating layer 720 interposed therebetween to form the capacitor Cst. The gate electrode 240 of the first transistor T1 may be a first electrode of the capacitor Cst, the extended region of the capacitor electrode line 310 which overlaps the first electrode may be a second electrode of the capacitor Cst, and the second insulating layer 720 interposed between the first electrode and the second electrode may be a dielectric of the capacitor Cst.

In the region which overlaps the gate electrode 240 of the first transistor T1, the capacitor electrode line 310 may have an increased width. The capacitor electrode line 310 may include an opening which overlaps the gate electrode 240 of the first transistor T1 therebelow in the extended region.

The initialization voltage line 320 may be located on one side of the pixel PX in the second direction DR2 in the plan view. The initialization voltage line 320 may overlap the fifth vertical portion 170 of the semiconductor layer 100.

The second conductive layer 300 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (T1), tantalum (Ta), tungsten (W), and/or copper (Cu).

The third insulating layer 730 covers the second conductive layer 300. The third insulating layer 730 may be generally disposed (or disposed substantially) over an entire surface of the substrate 750. The third insulating layer 730 may be an interlayer insulating film. The third insulating layer 730 may include the same material as the second insulating layer 720 or may include one or more metals selected from materials illustrated as constituent materials of the second insulating layer 720.

The third conductive layer 400 is disposed on the third insulating layer 730. The third conductive layer 400 may include a plurality of data patterns 410 and 420, a first anode connection electrode 430 which mediates an electrical connection between the anode electrode of the organic light-emitting diode OLED and the semiconductor layer 100, a first power voltage line 440 which supplies the first power voltage ELVDD (e.g., see FIG. 4 and hereinafter the same), and a data line 450 which transmits a data signal DATA (e.g., see FIG. 2 and hereinafter the same).

The plurality of data patterns may include a first data pattern 410 and a second data pattern 420. Each of the data patterns 410 and 420 has a shape generally extending (or extending substantially) in the second direction DR2, where a length of each of the data patterns 410 and 420 in the second direction DR2 is smaller than a length of the pixel PX in the second direction DR2. The data patterns 410 and 420 are physically spaced apart from each other. Each of the data patterns 410 and 420 may electrically connect portions separated from each other.

The first data pattern 410 may overlap the gate electrode 240 of the first transistor T1. In the overlapping region, the first data pattern 410 may be electrically connected to the gate electrode 240 of the first transistor T1 through a first contact hole CNT1 which passes through the third insulating layer 730 and the second insulating layer 720 and exposes the gate electrode 240 of the first transistor T1. The first contact hole CNT1 may be located in the opening of the capacitor electrode line 310. The first data pattern 410 located in the first contact hole CNT1 and the capacitor electrode line 310 adjacent to the first data pattern 410 may be insulated from each other through the third insulating layer 730.

Further, the first data pattern 410 may extend upward from a region which overlaps the gate electrode 240 of the first transistor T1 to be insulated from and cross the first scan line 210 and may overlap a portion of the second horizontal portion 140 of the semiconductor layer 100. In the overlapping region, the first data pattern 410 may be electrically connected to the second horizontal portion 140 of the semiconductor layer 100 through a second contact hole CNT2 which passes through the third insulating layer 730, the second insulating layer 720, and the first insulating layer 710 and exposes the portion of the second horizontal portion 140 of the semiconductor layer 100. The portion of the second horizontal portion 140 may be the second region of the $3^{rd}$-1 transistor T3_1, but the present disclosure is not limited thereto.

In other words, the first data pattern 410 may electrically connect the gate electrode 240 of the first transistor T1 to the second horizontal portion 140 of the semiconductor layer 100.

The second data pattern 420 may overlap the third connection portion 183 of the semiconductor layer 100. In the overlapping region, the second data pattern 420 may be electrically connected to the third connection portion 183 of the semiconductor layer 100 through a fourth contact hole CNT4 which passes through the third insulating layer 730, the second insulating layer 720, and the first insulating layer 710 and exposes the third connection portion 183 of the semiconductor layer 100.

Further, the second data pattern 420 may extend upward from a region which overlaps the third connection portion 183 of the semiconductor layer 100 to be insulated from and cross the second scan line 230 and may overlap the initialization voltage line 320. In the overlapping region, the second data pattern 420 may be electrically connected to the initialization voltage line 320 through a fifth contact hole CNT5 which passes through the third insulating layer 730 and exposes the initialization voltage line 320.

In other words, the second data pattern 420 may electrically connect the third connection portion 183 of the semiconductor layer 100 to the initialization voltage line 320.

The first anode connection electrode 430 has a shape generally extending (or extending substantially) in the second direction DR2, where a length of the first anode connection electrode 430 in the second direction DR2 is smaller than the length of the pixel PX in the second direction DR2. The first anode connection electrode 430 is physically spaced apart from the plurality of data patterns 410 and 420. The first anode connection electrode 430 may connect the semiconductor layer 100 to the anode electrode ANO together with a second anode connection electrode 530 which will be described below.

The first anode connection electrode 430 may overlap the lower portion 122 of the second vertical portion 120 of the semiconductor layer 100. The first anode connection electrode 430 may be electrically connected to the lower portion 122 of the second vertical portion 120 of the semiconductor layer 100 through a sixth contact hole CNT6 which passes through the third insulating layer 730, the second insulating layer 720, and the first insulating layer 710 and exposes the lower portion 122 of the second vertical portion 120 of the semiconductor layer 100.

The first power voltage line 440 may extend along the second direction DR2. The first power voltage line 440 may extend to a neighboring pixel PX beyond the boundary of the pixel PX along the second direction DR2. The first power voltage line 440 is disposed generally adjacent, substantially adjacent, or adjacent to a left side of the pixel PX where the first power voltage line 440 may be disposed on one side of the data line 450 in the first direction DR1, but the present disclosure is not limited thereto. The first power voltage line 440 may be electrically connected to the capacitor electrode line 310 through an eighth contact hole CNT8 which passes through the third insulating layer 730 and exposes the capacitor electrode line 310.

Further, the first power voltage line 440 may be electrically connected to the lower portion 112 of the first vertical portion 110 of the semiconductor layer 100 through a seventh contact hole CNT7 which passes through the third insulating layer 730, the second insulating layer 720, and the first insulating layer 710 and exposes the lower portion 112 of the first vertical portion 110 of the semiconductor layer 100.

The data line 450 may extend along the second direction DR2. The data line 450 may extend to a neighboring pixel PX beyond the boundary of the pixel PX along the second direction DR2. The data line 450 may be disposed adjacent to the other side of the pixel PX in the first direction DR1. The data line 450 may overlap the first vertical portion 110 of the semiconductor layer 100.

The data line 450 may be in contact with the upper portion 111 of the first vertical portion 110 of the semiconductor layer 100 through a third contact hole CNT3 which passes through the third insulating layer 730, the second insulating layer 720, and the first insulating layer 710 and exposes the upper portion 111 of the first vertical portion 110 of the semiconductor layer 100. The third contact hole CNT3 may be located below the second scan line 230 in the plan view, but the present disclosure is not limited thereto.

The third conductive layer 400 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (T1), tantalum (Ta), tungsten (W), and/or copper (Cu). The third conductive layer 400 may be a single film or a multilayer film. For example, the third conductive layer 400 may be formed in a stacked structure of T1/Al/T1, Mo/Al/Mo, Mo/AlGe/Mo, Ti/Cu, or the like.

The protective layer 740 may be formed on the third conductive layer 400. The protective layer 740 may be formed of an inorganic film, for example, a silicon nitride layer, a silicon oxynitride layer, a silicon oxide layer, a titanium oxide layer, and/or an aluminum oxide layer. However, in one or more embodiments, the protective layer 740 may be omitted.

The first via layer VIA1 is disposed on the protective layer 740. The first via layer VIA1 may be a planarization film. The first via layer VIA1 may include an inorganic insulating material or an organic insulating material such as polyacrylate resin, epoxy resin, phenolic resin, polyamide resin, polyimide resin, unsaturated polyester resin, a polyphenylene ether resin, polyphenylene sulfide resin, BCB, and/or the like.

The fourth conductive layer 500 is disposed on the first via layer VIA1. The fourth conductive layer 500 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (T1), tantalum (Ta), tungsten (W), and/or copper (Cu).

The fourth conductive layer 500 may include the second anode connection electrode 530. A first anode contact hole ACNT1 which exposes the first anode connection electrode 430 may be disposed in the first via layer VIA1, and the second anode connection electrode 530 may be connected to the first anode connection electrode 430 through the first anode contact hole ACNT1.

The second via layer VIA2 is disposed on the fourth conductive layer 500. The second via layer VIA2 may be a planarization film. The second via layer VIA2 may include an inorganic insulating material or an organic insulating material such as a polyacrylate resin, an epoxy resin, a phenolic resin, a polyamide resin, a polyimide resin, an unsaturated polyester resin, a polyphenylene ether resin, a polyphenylene sulfide resin, BCB, and/or the like.

The fifth conductive layer 600 is disposed on the second via layer VIA2. The fifth conductive layer 600 may include anode electrodes ANO. The anode electrodes ANO in each pixel PX may be disposed separately from each other. The anode electrode ANO may be electrically connected to the second anode connection electrode 530 through a second anode contact hole ACNT2 which passes through the second via layer VIA2 and exposes the second anode connection electrode 530.

The anode electrode ANO is not limited thereto and may have a stacked film structure in which a material layer having a high work function, such as indium tin oxide (ITO), indium zinc oxide (IZO), zinc oxide (ZnO), or indium oxide ($In_2O_3$) and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof are stacked. A layer having a high work function may be disposed above the reflective material layer and disposed close to a light-emitting layer EL. The anode electrode ANO may have a multilayer structure of ITO/Mg, ITO/MgF, ITO/Ag, and ITO/Ag/ITO, but the present disclosure is not limited thereto.

The pixel definition film PDL may be disposed on the fifth conductive layer 600. The pixel definition film PDL may include an opening which partially exposes the anode electrode ANO. The pixel definition film PDL may be made of an organic insulating material or an inorganic insulating material. For example, the pixel definition film PDL may include at least one of a polyimide resin, an acrylic resin, a silicone compound, a polyacrylic resin, and/or the like.

The light-emitting layer EL is disposed on the anode electrode ANO exposed by the pixel definition film PDL. The light-emitting layer EL may include an organic material layer. The organic material layer of the light-emitting layer may include an organic light-emitting layer and may further include a hole injection/transport layer and/or an electron injection/transport layer.

A cathode electrode CAT may be disposed on the light-emitting layer EL. The cathode electrode CAT may be a common electrode disposed over an entirety of pixels without distinguishing the pixels PX. Each of the anode electrode ANO, the light-emitting layer EL, and the cathode electrode CAT may form an organic light-emitting element.

The cathode electrode CAT may include a material layer having a low work function such as Li, Ca, LiF/Ca, LiF/Al, Al, Mg, Ag, Pt, Pd, Ni, Au Nd, Ir, Cr, BaF, Ba, a compound thereof, or a mixture (e.g., a mixture of Ag and Mg, etc.) thereof. The cathode electrode CAT may further include a transparent metal oxide layer disposed on the material layer having the low work function.

The anode electrode ANO, the light-emitting layer EL, and the cathode electrode CAT may constitute an organic light-emitting element.

A thin film encapsulation layer 770 including a first inorganic film 771, a first organic film 772, and a second inorganic film 773 is disposed above the cathode electrode CAT. The first inorganic film 771 and the second inorganic film 773 may be in contact with each other at an end portion of the thin film encapsulation layer 770. The first organic film 772 may be sealed by the first inorganic film 771 and the second inorganic film 773.

Each of the first inorganic film 771 and the second inorganic film 773 may include silicon nitride, silicon oxide, silicon oxynitride, or the like. The first organic film 772 may include an organic insulating material.

Hereinafter, in the method of manufacturing the display device, a method of doping a semiconductor layer will be described.

Figure 10:
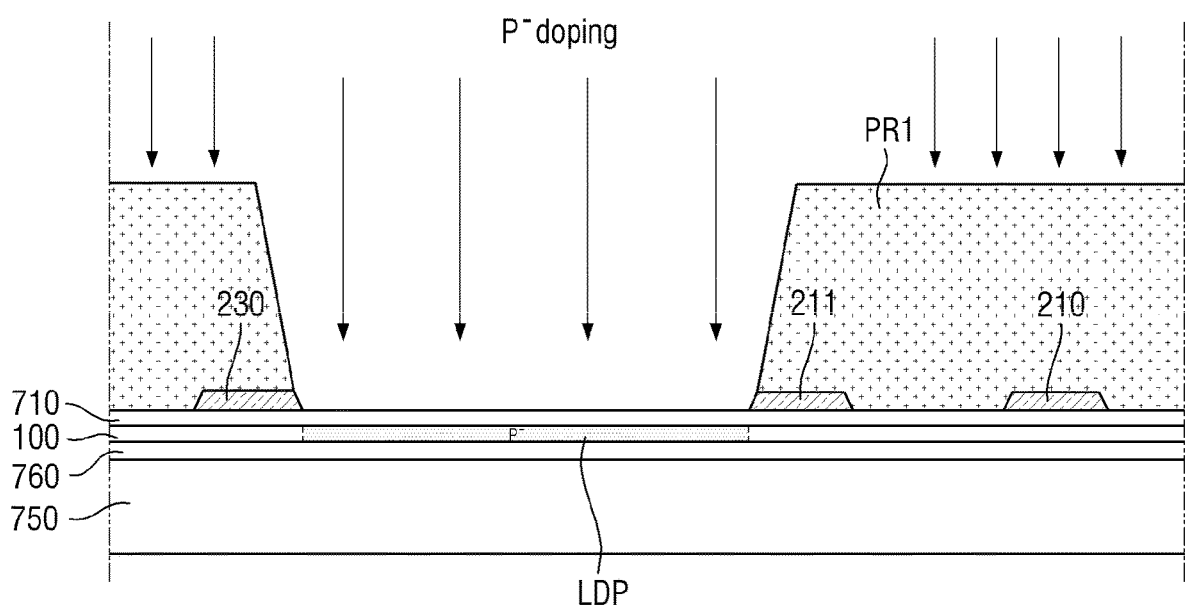
FIGS. 10 and 11 are cross-sectional views illustrating process operations of a method of doping a semiconductor layer in a method of manufacturing a display device according to one or more embodiments of the present disclosure.
Figure 11:
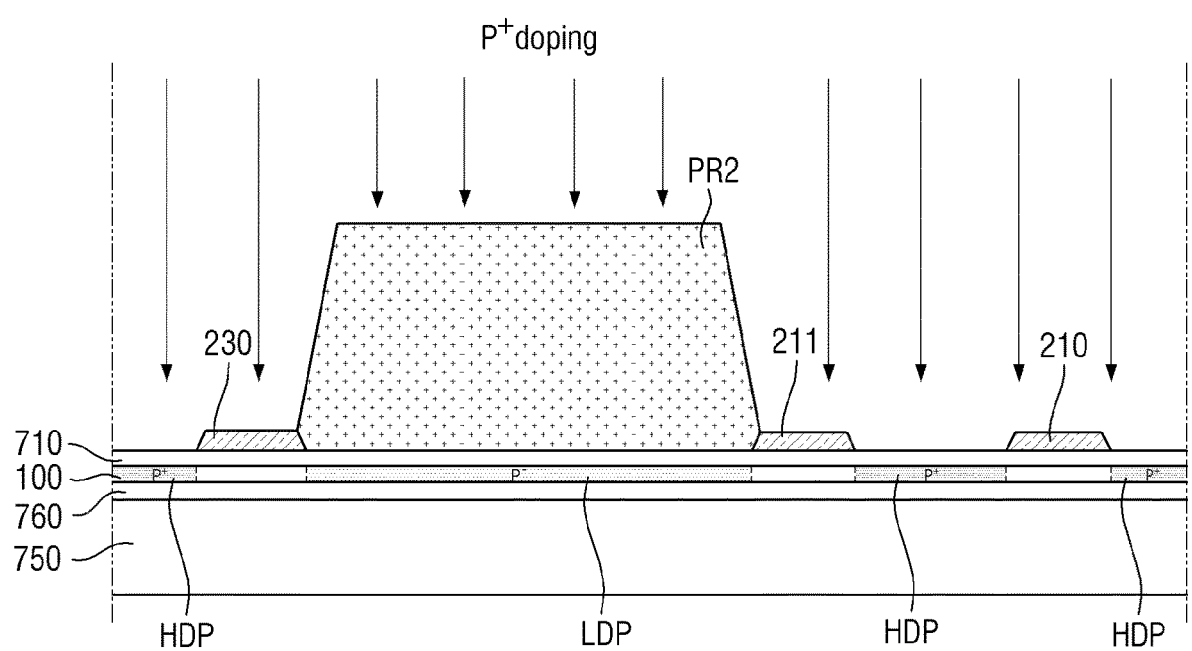

FIGS. 10 and 11 are cross-sectional views illustrating process operations of a method of doping a semiconductor layer in a method of manufacturing a display device according to one or more embodiments of the present disclosure.

Referring to FIG. 10, a substrate 750 is provided and a buffer layer 760 is stacked on an entire surface of the substrate 750. A material for a semiconductor layer may be deposited on an entire surface of the buffer layer 760 and then patterned by a photolithography process so that the patterned semiconductor layer 100 may be formed as illustrated in FIGS. 5 and 6. A first insulating layer 710 is formed on the buffer layer 760 on which the patterned semiconductor layer 100 is disposed. A material layer for a first conductive layer may be deposited on an entire surface of the first insulating layer 710 and then patterned by a photolithography process so that a first conductive layer 200 including a first scan line 210, an emission control line 220, and a second scan line 230 may be formed as illustrated in FIGS. 5 and 6.

Thereafter, a first photoresist pattern PR1 which exposes a portion of the semiconductor layer 100, that is, a first doped region LDP, may be formed on the first insulating layer 710 on which the first conductive layer 200 is disposed, and P⁻ doping with a low concentration may be performed only in the first doped region LDP using the first photoresist pattern PR1 as a mask.

Subsequently, referring to FIG. 11, a second photoresist pattern PR2, which covers the portion of the semiconductor layer 100, that is, the first doped region LDP and exposes a second doped region HDP serving as a remaining non-overlapping region DP except for the first doped region LDP, is formed on the first insulating layer 710 on which the first conductive layer 200 is disposed, and P⁺ doping with a high concentration may be performed only in the second doped region HDP using the second photoresist pattern PR2 as a mask. In this case, the second photoresist pattern PR2 may expose or cover the first conductive layer 200. In one or more embodiments, the first conductive layer 200 may be used as a mask itself, and doping may not be performed even when the semiconductor layer 100 which overlaps the first conductive layer 200 is not covered with the second photoresist pattern PR2.

A method of stacking the remaining stacked members after the doping on the semiconductor layer 100 is completed is well known in the art, and thus a detailed description thereof will be omitted.

Figure 12:
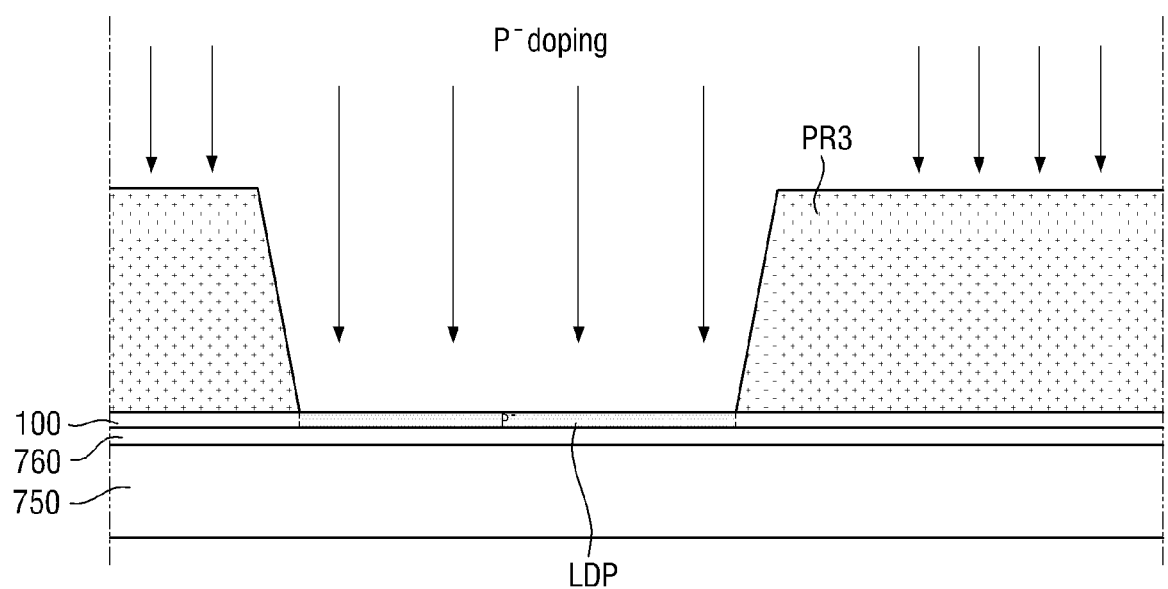
FIGS. 12 and 13 are cross-sectional views illustrating process operations of a method of doping a semiconductor layer in the method of manufacturing a display device according to one or more embodiments of the present disclosure.
Figure 13:
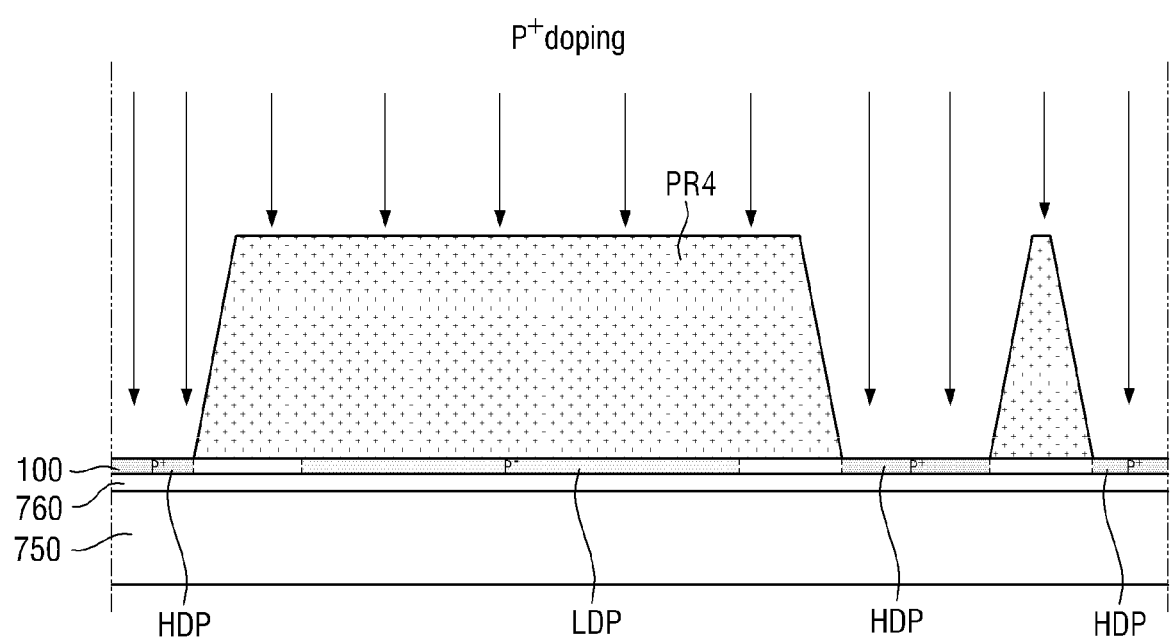

FIGS. 12 and 13 are cross-sectional views illustrating process operations of another method of doping a semiconductor layer in a method of manufacturing a display device according to one or more embodiments of the present disclosure.

Referring to FIG. 12, a substrate 750, a buffer layer 760, and a patterned semiconductor layer 100 are stacked in the same manner as described above. Thereafter, a third photoresist pattern PR3 which exposes the portion of the semiconductor layer 100, that is, a first doped region LDP, is formed on the semiconductor layer 100 without stacking a first insulating layer 710 and a first conductive layer 200, and P⁻ doping with a low concentration may be performed only in the first doped region LDP using the third photoresist pattern PR3 as a mask.

Subsequently, referring to FIG. 13, a fourth photoresist pattern PR4, which covers the portion of the semiconductor layer 100, that is, the first doped region LDP, and exposes the second doped region HDP serving as a remaining non-overlapping region DP except for the first doped region LDP, is formed on the semiconductor layer 100, and P⁺ doping with a high concentration may be performed only in the second doped region HDP using the fourth photoresist pattern PR4 as a mask. Therefore, in one or more embodiments, the first conductive layer 200, which may be used as a mask itself, is omitted, and thus the fourth photoresist pattern PR4 may also cover the portion of the semiconductor layer 100 which overlaps the first conductive layer 200 by a subsequent process.

Figure 14:
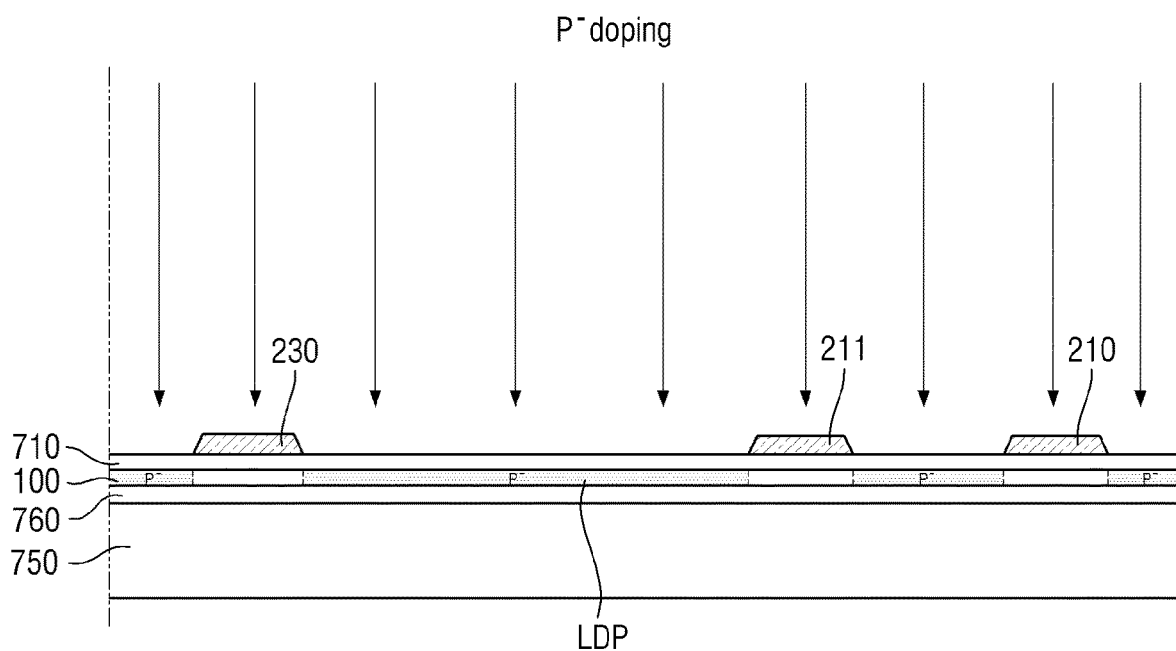
FIGS. 14 and 15 are cross-sectional views illustrating process operations of a method of doping a semiconductor layer in the method of manufacturing a display device according to one or more embodiments of the present disclosure.
Figure 15:
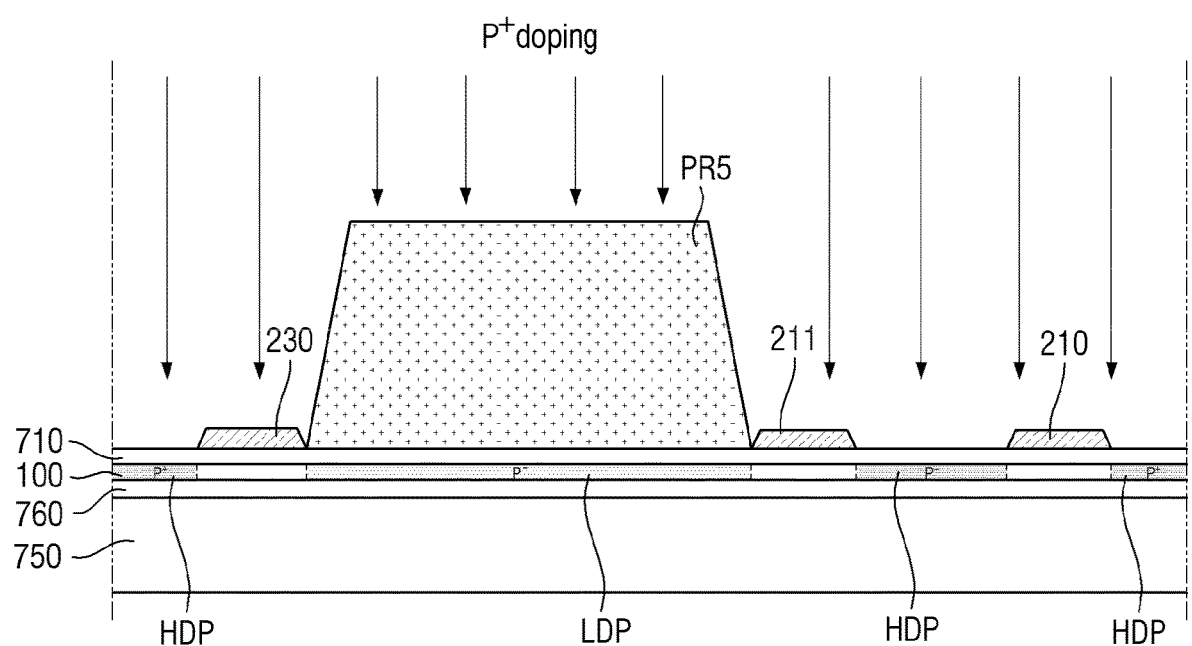

FIGS. 14 and 15 are cross-sectional views illustrating process operations of doping a semiconductor layer in a method of manufacturing a display device according to one or more embodiments of the present disclosure.

Referring to FIG. 14, a substrate 750, a buffer layer 760, a semiconductor layer 100, a first insulating layer 710, and a first conductive layer 200 may be stacked as in the doping method of FIGS. 10 and 11. Subsequently, P⁻ doping with a low concentration may be performed only on the first insulating layer 710, on which the first conductive layer 200 is disposed, without a photoresist pattern. Therefore, in one or more embodiments as described above, the first conductive layer 200 may be used as a mask itself. Accordingly, P⁻ doping with a low concentration may be performed on the portion of the semiconductor layer 100 that does not overlap the first conductive layer 200, that is, an entirety of a non-overlapping region DP.

Subsequently, referring to FIG. 15, a fifth photoresist pattern PR5, which covers the portion of the semiconductor layer 100, that is, a first doped region LDP, and exposes a second doped region HDP serving as a remaining non-overlapping region DP except for the first doped region LDP, is formed on the first insulating layer 710 on which the first conductive layer 200 is disposed, and P⁺ doping with a high concentration may be performed only in the second doped region HDP using the fifth photoresist pattern PR5 as a mask. Therefore, in one or more embodiments, the fifth photoresist pattern PR5 may expose or cover the first conductive layer 200. Accordingly, in one or more embodiments, both of the P⁻ doping with the low concentration and the P⁺ doping with the high concentration may be performed in the second doped region HDP. However, a concentration of the P⁻ doping with the low concentration is lower than that of the P⁺ doping with the high concentration, and thus a concentration of impurity ions doped in the second doped region HDP may not be significantly affected.

Figure 16:
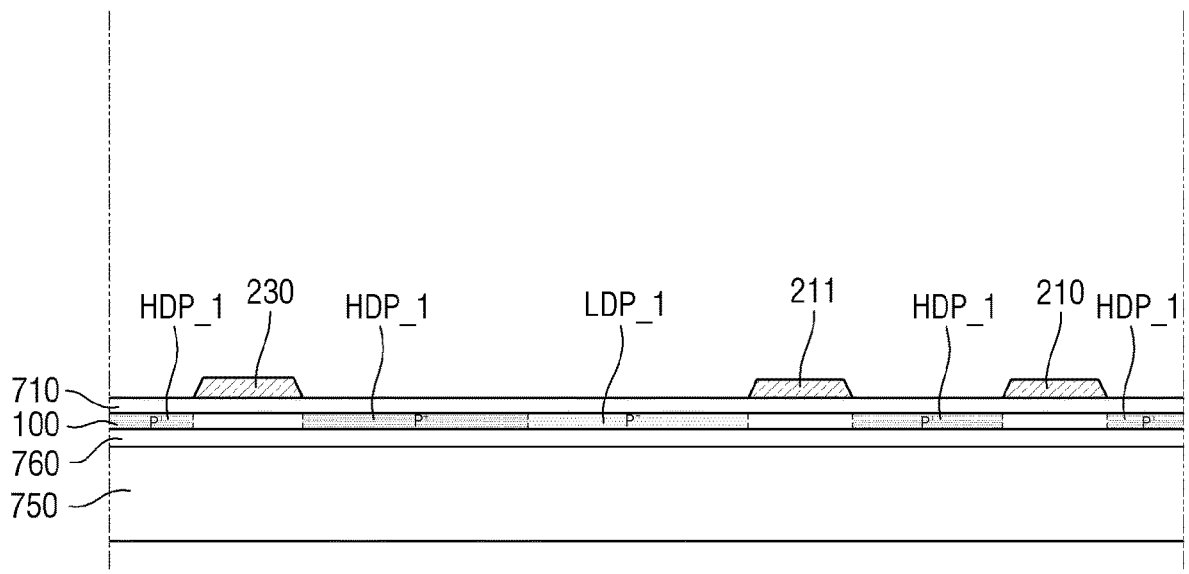
FIG. 16 is a cross-sectional view illustrating a semiconductor layer and a first conductive layer of a display device according to one or more embodiments of the present disclosure.

FIG. 16 is a cross-sectional view illustrating a semiconductor layer and a first conductive layer of a display device according to one or more embodiments of the present disclosure.

Referring to FIG. 16, the display device according to one or more embodiments is different from the display device in the embodiments of FIGS. 5 and 9 in that a first doped region LDP_1 is formed of only a portion of a region of a semiconductor layer 100 that is disposed between a gate electrode of a $3^{rd}$-1 transistor T3_1 and a $4^{th}$-1 transistor T4_1 (e.g., in a plan view).

In one or more embodiments, a portion of the semiconductor layer 100 disposed between the gate electrode of the $3^{rd}$-1 transistor T3_1 (e.g., upward protrusion 211) and the $4^{th}$-1 transistor T4_1 may include both the first doped region LDP_1 and a second doped region HDP_1 that have different concentrations of impurity ions. In other words, a portion of the second horizontal portion 140, a portion of the third vertical portion 150, and the first connection portion 181 (e.g., as shown in FIG. 6) may form both the first doped region LDP_1 and the second doped region HDP_1. In one or more embodiments, the first doped region LDP_1 may be disposed adjacent to the semiconductor layer 100 which overlaps the gate electrode of the $3^{rd}$-1 transistor T3_1. Further, the first doped region LDP_1 may include a second region of the $3^{rd}$-1 transistor T3_1.

Even in the case where the first doped region LDP_1 is formed of only a portion of the region of the semiconductor layer 100 that is disposed between the gate electrode of the $3^{rd}$-1 transistor T3_1 and the $4^{th}$-1 transistor T4_1, the first doped region LDP_1 includes the second region of the $3^{rd}$-1 transistor T3_1, and thus, a leakage current may be suppressed or prevented even when a separate voltage is not applied to any one of the first electrode and the second electrode connected to the second region. Accordingly, an increase in power consumption due to the leakage current, staining of the panel, flicker, and the like may be prevented or reduced, and the display device may be smoothly operated.

Figure 17:
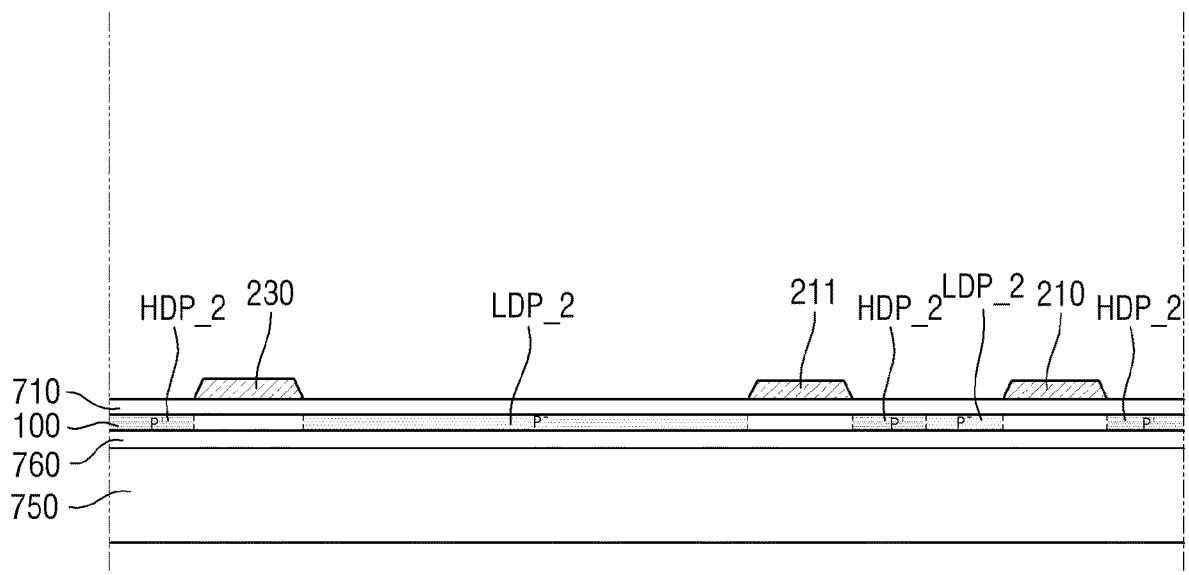
FIG. 17 is a cross-sectional view illustrating a semiconductor layer and a first conductive layer of a display device according to one or more embodiments of the present disclosure.

FIG. 17 is a cross-sectional view illustrating a semiconductor layer and a first conductive layer of a display device according to one or more embodiments of the present disclosure.

Referring to FIG. 17, the display device according to one or more embodiments is different from the display device in the embodiment of FIGS. 5 and 9 in that a first doped region LDP_2 further includes at least a portion of a region of a semiconductor layer 100 disposed between a gate electrode of a $3^{rd}$-1 transistor T3_1 and a $3^{rd}$-2 transistor T3_2 (e.g., in a plan view).

Specifically, the first doped region LDP_2 according to one or more embodiments may include at least a portion of a region of the semiconductor layer 100 disposed between the gate electrode of the $3^{rd}$-1 transistor T3_1 and the $3^{rd}$-2 transistor T3_2 as well as the region of the semiconductor layer 100 disposed between the gate electrode of the $3^{rd}$-1 transistor T3_1 and the $4^{th}$-1 transistor T4_1. At least a portion of the region disposed between the gate electrode of the $3^{rd}$-1 transistor T3_1 and the $3^{rd}$-2 transistor T3_2 forming the first doped region LDP_2 may include a second region of the $3^{rd}$-2 transistor T3_2. In other words, an upper portion 121 of the second vertical portion 120 between the gate electrode of the 3rd-1 transistor T3_1 and the gate electrode of the 3rd-2 transistor T3_2 (defined by the upward protrusion 211 and the scan line 210 respectively as shown in FIG. 6) in a plan view may include a first doped region LDP_2 and a second doped region HDP_2 that have different concentrations of impurity ions.

Even in this case, the first doped region LDP_2 includes the second region of the $3^{rd}$-1 transistor T3_1 and the second region of the $3^{rd}$-2 transistor T3_2, and thus a leakage current may be suppressed or prevented even when a separate voltage is not applied to any one of the first electrode and the second electrode connected to the second region of the $3^{rd}$-1 transistor T3_1. Accordingly, an increase in power consumption due to the leakage current, staining of the panel, flicker, and the like may be prevented or reduced, and the display device may be smoothly operated. In addition, both of the second region of the $3^{rd}$-1 transistor T3_1 and the second region of the $3^{rd}$-2 transistor T3_2 of the third transistor T3, which are formed as dual transistors, are formed of a first doped region LDP_2, and thus an effect of suppressing or preventing the leakage current may be increased. In other words, an upper portion 121 of the second vertical portion 120 between the gate electrode of the 3rd-1 transistor T3_1 and the gate electrode of the 3rd-2 transistor T3_2 (defined by the upward protrusion 211 and the scan line 210 respectively as shown in FIG. 6) in a plan view may include a first doped region LDP_2 and a second doped region HDP_2 that have different concentrations of impurity ions.

Figure 18:
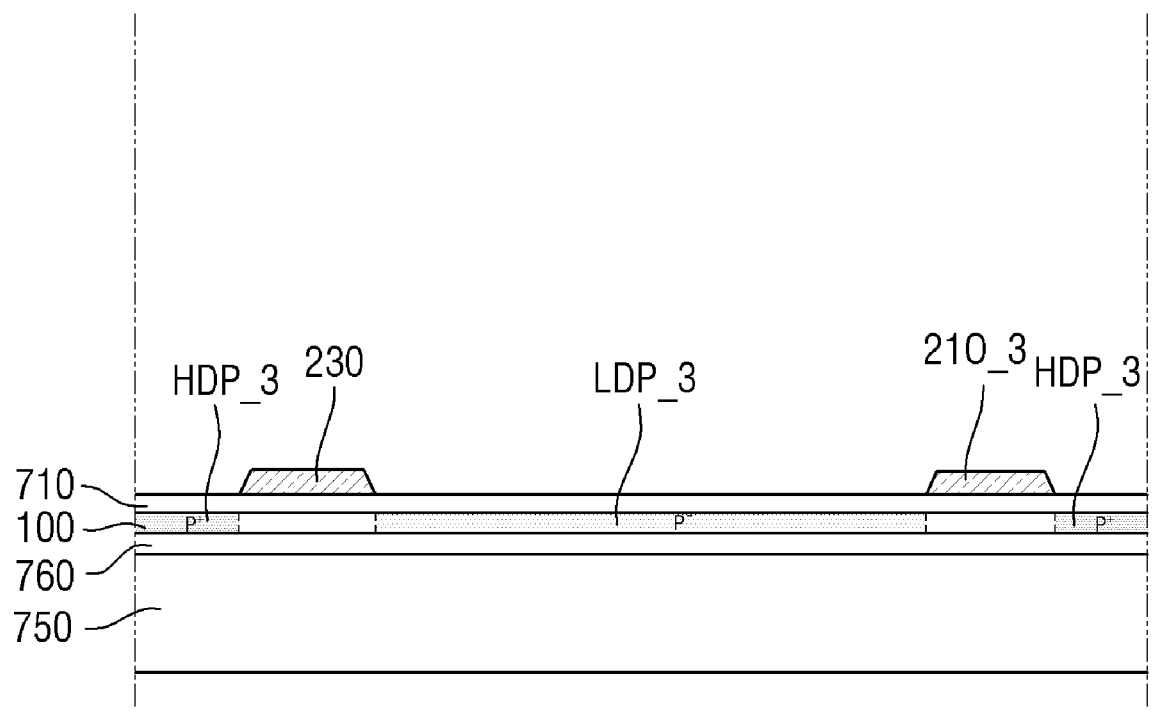
FIG. 18 is a cross-sectional view illustrating a semiconductor layer and a first conductive layer of a display device according to one or more embodiments of the present disclosure.

FIG. 18 is a cross-sectional view illustrating a semiconductor layer and a first conductive layer of a display device according to one or more embodiments of the present disclosure.

The display device according to the one or more embodiments is different from the display device in the embodiment of FIGS. 5 and 9 in that a third transistor T3 is formed as a single transistor instead of a dual transistor (e.g., a dual-gate transistor).

Specifically, the third transistor T3 according to one or more embodiments may be formed as a single transistor, and a first doped region LDP_3 may be formed of a portion of the semiconductor layer 100 disposed between a gate electrode of the third transistor T3 and a $4^{th}$-1 transistor T4_1 (e.g., in a plan view). Further, the first doped region LDP_3 may include a second region of the third transistor T3. One skilled in the art would appreciate that, in one or more embodiments, the first doped region LDP_3, the second doped region HDP_3 and the scan line 210_3 correspond to the first doped region LDP, the second doped region HDP and the scan line 210 described in the embodiment of FIGS. 5 and 9 with suitable changes to accommodate a single transistor instead of a dual transistor as shown in FIG. 18.

Even in this case, the first doped region LDP_3 includes the second region of the third transistor T3, and thus a leakage current may be suppressed or prevented even when a separate voltage is not applied to any one of the first electrode and the second electrode connected to the second region. Accordingly, an increase in power consumption due to the leakage current, staining of the panel, flicker, and the like may be prevented or reduced, and the display device may be smoothly operated.

While the present invention has been particularly shown and described with reference to some example embodiments thereof, it will be understood by those of ordinary skill in the art that various changes in form and details may be made therein without departing from the spirit and scope of the present invention as set forth in the following claims and their equivalents.

What is claimed is:

1. A display device comprising:
    scan lines to which scan signals are applied;
    data lines to which data voltages are applied; and
    pixels connected to the scan lines and the data lines,
    wherein each of the pixels comprises a first transistor configured to control a driving current which flows from a first electrode to a second electrode according to a voltage applied to a gate electrode, a light-emitting element connected to the second electrode of the first transistor and configured to emit light according to the driving current, and a third transistor electrically connected between the gate electrode and the second electrode of the first transistor,
    wherein the third transistor comprises an active layer comprising a first region connected to the second electrode of the first transistor, a second region connected to the gate electrode of the first transistor, and a channel region between the first region and the second region,
    wherein electrical resistance of the second region is greater than electrical resistance of the first region,
    wherein a concentration of impurity ions doped in the first region is different from a concentration of impurity ions doped in the second region,
    wherein the concentration of the impurity ions doped in the first region is substantially uniform in the first region, and
    wherein the concentration of the impurity ions doped in the second region is substantially uniform in the second region.

2. The display device of claim 1, wherein:
    the first region is in direct contact with a first electrode of the third transistor;
    the second region is in direct contact with a second electrode of the third transistor; and
    the first region and the second region are in direct contact with a channel region of the third transistor.

3. The display device of claim 1, wherein impurity ions doped in the first region and impurity ions doped in the second region are the same impurity ions.

4. The display device of claim 1, wherein both the first transistor and the third transistor are a p-type metal-oxide-semiconductor (PMOS) transistor.

5. The display device of claim 4, wherein the PMOS transistor comprises polycrystalline silicon.

6. The display device of claim 1, further comprising a second transistor electrically connected between any one data line of the data lines and the first electrode of the first transistor.

7. A display device comprising:
scan lines to which scan signals are applied;
data lines to which data voltages are applied; and
pixels connected to the scan lines and the data lines,
wherein each of the pixels comprises a first transistor configured to control a driving current which flows from a first electrode to a second electrode according to a voltage applied to a gate electrode, a light-emitting element connected to the second electrode of the first transistor and configured to emit light according to the driving current, and a third transistor electrically connected between the gate electrode and the second electrode of the first transistor,
wherein the third transistor comprises an active layer comprising a first region connected to the second electrode of the first transistor, a second region connected to the gate electrode of the first transistor, and a channel region between the first region and the second region, and
wherein electrical resistance of the second region is greater than electrical resistance of the first region,
wherein a concentration of impurity ions doped in the first region is greater than a concentration of impurity ions doped in the second region and the concentration of the impurity ions doped in the second region is greater than a concentration of impurity ions doped in the channel region.

8. A display device comprising:
scan lines to which scan signals are applied;
data lines to which data voltages are applied; and
pixels connected to the scan lines and the data lines,
wherein each of the pixels comprises a first transistor configured to control a driving current which flows from a first electrode to a second electrode according to a voltage applied to a gate electrode, a light-emitting element connected to the second electrode of the first transistor and configured to emit light according to the driving current, and a third transistor electrically connected between the gate electrode and the second electrode of the first transistor,
wherein the third transistor comprises an active layer comprising a first region connected to the second electrode of the first transistor, a second region connected to the gate electrode of the first transistor, and a channel region between the first region and the second region,
wherein electrical resistance of the second region is greater than electrical resistance of the first region, and
wherein a concentration of impurity ions doped in the first region is about twice a concentration of impurity ions doped in the second region or more.

9. The display device of claim 8, wherein:
the concentration of the impurity ions doped in the first region ranges from about $1E15/cm^3$ to about $4E15/cm^3$, and
the concentration of the impurity ions doped in the second region ranges from about $5E14/cm^3$ to about $2E15/cm^3$.

* * * * *